Figure 1:
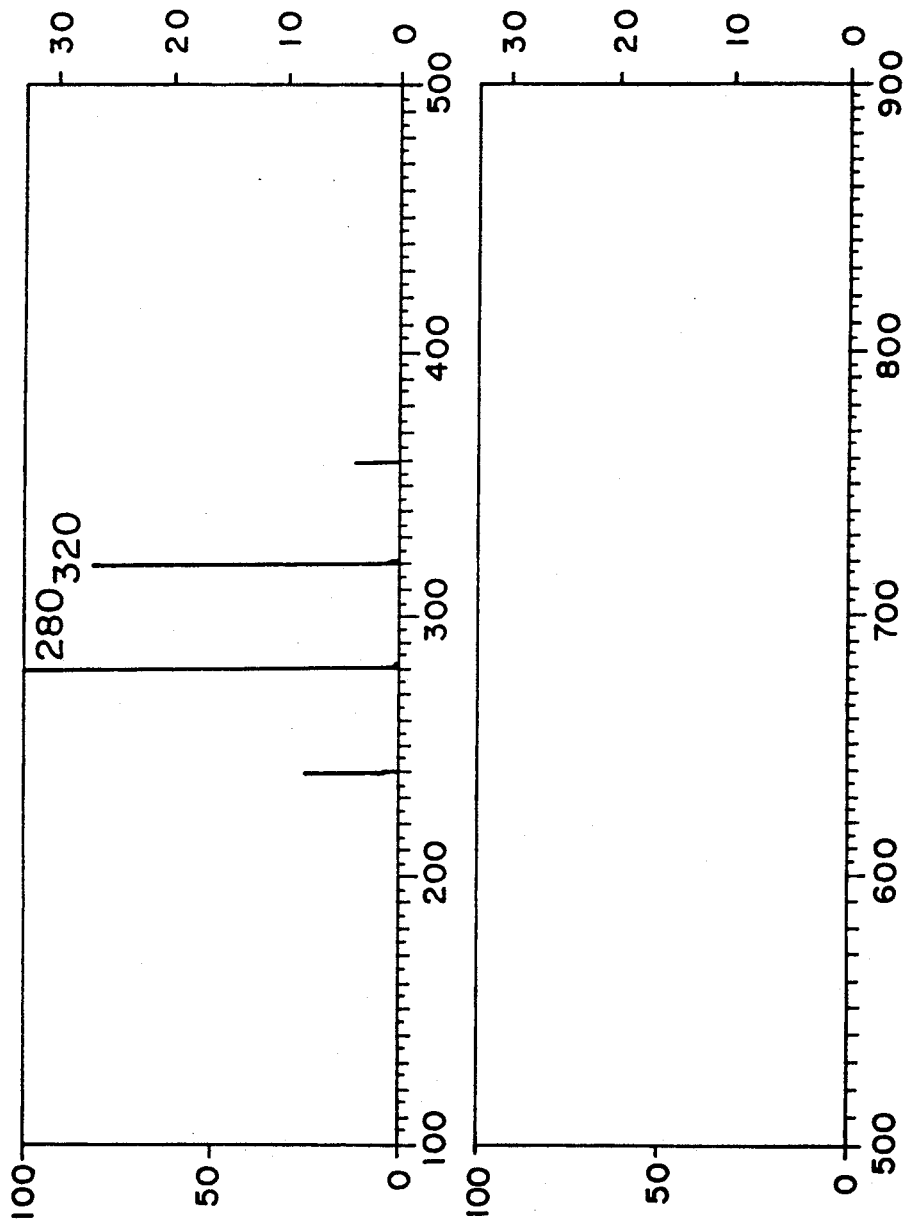

United States Patent [19]

Naitoh et al.

[11] Patent Number: 5,109,087
[45] Date of Patent: Apr. 28, 1992

[54] AROMATIC ALLYL AMINE THERMOSETTING RESIN COMPOSITION

[75] Inventors: Shigeki Naitoh; Yasuhisa Saito; Yasuhiro Hirano; Kazuo Takebe; Kunimasa Kamio; Youichi Ueda, all of Ibaraki, Japan

[73] Assignee: Sumitomo Chemical Company, Limited, Osaka, Japan

[21] Appl. No.: 464,228

[22] Filed: Jan. 12, 1990

[30] Foreign Application Priority Data

Jan. 12, 1989 [JP] Japan .................................. 1-6894
Mar. 23, 1989 [JP] Japan .................................. 1-73054
Jun. 22, 1989 [JP] Japan .................................. 1-162099
Jun. 23, 1989 [JP] Japan .................................. 1-161292

[51] Int. Cl.$^5$ ............................................. C08F 22/40
[52] U.S. Cl. .................................................... 526/262
[58] Field of Search ........................................ 526/262

[56] References Cited

U.S. PATENT DOCUMENTS 4,526,835 7/1985 Takahashi et al. ............... 428/473.5
4,831,102 5/1989 Yamaya et al. ..................... 528/128

FOREIGN PATENT DOCUMENTS 0137750 8/1989 European Pat. Off. .
758382 3/1985 United Kingdom .

OTHER PUBLICATIONS

Chemical Abstracts, vol. 102, No. 22, Jun. 3, 1985, p. 71 Abstract No. 186478q.

Primary Examiner—Joseph L. Schofer
Assistant Examiner—Alex H. Walker
Attorney, Agent, or Firm—Antonelli, Terry, Stout & Kraus

[57] ABSTRACT

A thermosetting resin composition useful for a copper-clad laminate is provided, which comprise (A) an aromatic diamine compound represented by the following formula:

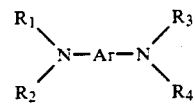

wherein Ar is a divalent aromatic residue, and $R_1$, $R_2$, $R_3$ and $R_4$ each is an allyl group or a hydrogen atom but at least one of them is an allyl group, and (B) a polymaleimide compound having two or more maleimide groups in a molecule thereof.

7 Claims, 18 Drawing Sheets

AROMATIC ALLYL AMINE THERMOSETTING RESIN COMPOSITION

The present invention relates to a thermosetting resin composition, and more particularly to a composition excellent in processability, heat resistance, mechanical properties and adhesion.

Thermosetting resins are widely used for various electric insulators, structural materials and the like as molded, impregnated, laminated or shaped articles. In recent years, durability under severe conditions is being requested to these materials, and heat resistance in particular has been one of the important characteristics.

Further, printed circuit substrates for electronic equipments are recently surface-packaged and multilayered in order to increase packaging density of loaded parts. Thus, the heat resistance and dimensional stability of the material to be used are extremely important.

Thermosetting polyimide resins and heat resistant epoxy resins have hitherto been used for such purposes.

In the past, a thermosetting polyimide resin composition is proposed in which an aromatic bismaleimide is used together with an aromatic diamine (Japanese Patent Publication (KOKOKU) 46-28250, Japanese Patent Publication (KOKAI) 63-48334). This polyimide resin is, however troublesome in molding and impregnation, because both components are solid at room temperature, and a mixture thereof is only molten at a high temperature give a highly viscous melt. Further, the resin is so low in curing reactivity that moulding requires a high temperature and a long period of time in order to give sufficient heat resistance to the product. In addition, the hardened product obtained has problems in physical properties at a high temperature, resistance to thermal deterioration and the like.

Moreover, in a case, for instance, where a multilayer plate is intended to be cured at 200° C. for 2 hours, reliability in connection at the through-hole plating part thereof is small, since rapid increase in a thermal expansion coefficient appears at a temperature higher than 200°-210° C., the glass transition temperature (Tg) of the cured resin, and the plate is subjected to a solder melt temperature as high as 260° C. Though the reliability is improved by making the Tg higher, it requires a severer curing condition, which raise a production cost. Furthermore, 4-4'-diaminodiphenylmethane of the raw material remaining in a prepreg has carcinogenecity. The conventional resins are weak in adhesion with a copper foil which forms circuits, because the hardened product shows insufficient flexibility and is brittle.

The heat resistant epoxy resins are not satisfactory in dimensional stability, mechanical and electrical properties at a high temperature, because they do not have enough heat resistance but adhesion.

After intensive research was made to obtain a resin composition excellent in heat resistance and also in processability, the present inventors succeeded in obtaining a resin composition which fulfills the both requirements by using an aromatic diamine compound allylated at its amine group and a polymaleimide compound.

The inventors further made intensive research to obtain a copper-clad laminate of a thermosetting resin which exhibits advanced heat resistance and good dimensional stability under short period processing and is free from the remaining diaminodiphenylmethane in the prepreg and excellent in adhesion. As the result, they have found that the above purpose is served by a copper-clad laminate of a thermosetting resin comprising an aromatic diamine compound allylated at its amino group and a polymaleimide compound The present invention is to provide a thermosetting resin composition comprising (A) an aromatic diamine compound allylated at its amino group and represented by the following formula (I):

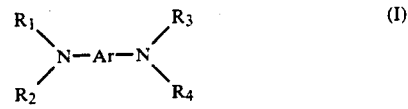

wherein Ar is a divalent aromatic residue, and $R_1$, $R_2$, $R_3$ and $R_4$ each is an allyl group or a hydrogen atom, provided that at least one of $R_1$, $R_2$, $R_3$ and $R_4$ is an allyl group; and (B) a polymaleimide compound having two or more maleimide groups in a molecule thereof.

The present invention is also to provide a copper-clad laminate of a thermosetting resin prepared by dissolving into an organic solvent the thermosetting resin composition described above to prepare resin varnish, impregnating a base material with the resin varnish, subjecting the impregnated material to a heat treatment to obtain)a prepreg, laminating the prepreg with copper foil, and processing the laminate by heating.

The present invention is further to provide an aromatic allylamine compound represented by the following formula:

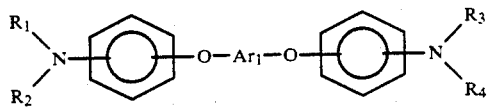

wherein $R_1$, $R_2$, $R_3$ and $R_4$ are as defined above, and $Ar_1$ is a divalent aromatic residue.

The present invention is further to provide an aromatic allylamine compound represented by the following formula:

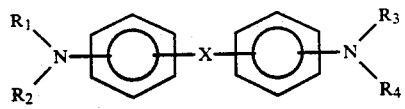

wherein $R_1$, $R_2$, $R_3$ and $R_4$ are as defined above, and X is O or S.

In the accompanying drawings, FIGS. 1 to 18 show FD-MS spectra and NMR spectra of the aromatic allylamine compounds obtained by the later-mentioned Examples.

The present invention will be explained hereunder in more detail.

The diamine compounds allylated at their amino groups which are used in the present invention, that is, the aromatic diamine compounds represented by the formula (I) are those wherein the symbol Ar is a divalent aromatic residue of mononucleus or polynuclei, in which the aromatic nucleus may be unsubstituted or substituted with a lower alkyl group, a halogen atom or a lower alkoxy group. In particular, when Ar is

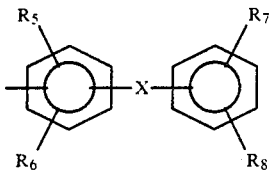 (II)

wherein X is

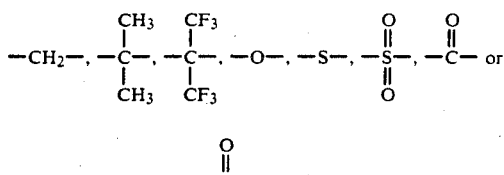

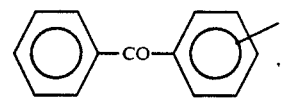

-continued the hardened product is not only excellent in heat resistance but also excellent in bending strength, and hence good toughness is obtained.

Compounds where the symbol Ar is represented by the above formula (II) and those where the symbol Ar is represented by the above formula (III) in which B is —O— and Y is

are preferred for the use of a copper-clad laminate.

and $R_5$, $R_6$, $R_7$ and $R_8$ each is a halogen atom, a lower alkyl group, particularly a methyl or ethyl group, or a hydrogen atom, extremely good heat resistance is obtained.

On the other hand, when the symbol Ar is

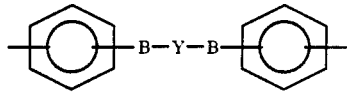 (III)

wherein B is —O— or —S—, preferably —O—, and Y is

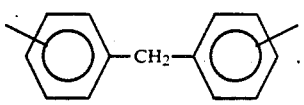

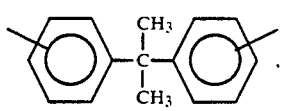

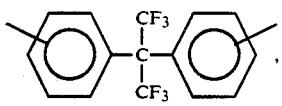

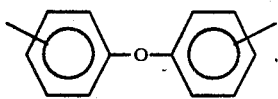

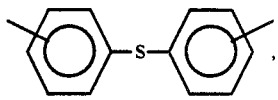

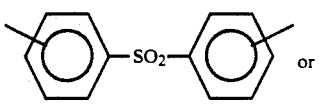 or

These compounds are easily prepared by various methods. For example, an aromatic diamine compound is allowed to react with an allyl halide compound to remove hydrogen halide. The aromatic diamines usable as a starting material in this reaction include, for example, 4,4'-diaminodiphenylmethane, 3,3'-diaminodiphenylmethane, 4,4'-diaminodiphenyl ether, 3,4'-diaminodiphenyl ether, 4,4'-diaminodiphenylpropane, 4,4'-diaminodiphenyl sulfone, 3,3'-diaminodiphenyl sulfone, 4,4'-diaminobenzophenone, 3,4'-diaminobenzophenone, 2,4-toluenediamine, 2,6-toluenediamine, m-phenylenediamine, p-phenylenediamine, benzidine, 4,4'-diaminodiphenyl sulfide, 3,3'-dichloro-4,4'-diaminodiphenyl sulfone, 3,3'-dichloro-4,4'-diaminodiphenylpropane, 3,3'-dimethyl-4,4'-diaminodiphenylmethane, 3,3'-dimethoxy-4,4'-diaminobiphenyl, 3,3'-dimethyl-4,4'-diaminobiphenyl, 1,3-bis(4-aminophenoxy)benzene, 1,3bis(3-aminophenoxy)benzene, 1,4-bis(4-aminophenoxy)benzene, 2,2-bis(4-aminophenoxyphenyl)propane, 4,4'-bis(4-aminophenoxy)diphenyl sulfone, 4,4'bis(3-aminophenoxy)diphenyl sulfone, 9,9'-bis(4aminophenyl)anthracene, 9,9'-bis(4-aminophenyl)fluorene, 3,3'-dicarboxy-4,4'-diaminodiphenylmethane, 2,4-diaminoanisole, bis(3-aminophenyl)methylphosphine oxide, 3,3'-diaminobenzophenone, o-toluidine sulfone, 4,4'-methylene-bis-ochloroaniline, tetrachlorodiaminodiphenylmethane, m-xylylenediamine, p-xylylenediamine, 4,4'-diaminostilbene, 5-amino-1-(4'-aminophenyl)-1,3,3-trimethylindan, 6-amino-1-(4'-aminophenyl)-1,3,3trimethylidan, 5-amino-6-methyl-1-(3'-amino-4'-methylphenyl)-1,3,3-trimethylindan, 7-amino-6-methyl-1-(3'-amino-4'-methylphenyl)-1,3,3-trimethylindan, 6-amino-5-methyl-1-(4'-amino-3'-methylphenyl)-1,3,3-trimethylindan, 6-amino-7-methyl-1(4'-amino-3'-methylphenyl)-1,3,3-trimethylindan and the like.

In particular, if the aromatic diamine compounds having two benzene nuclei such as diaminodiphenylmethanes and diaminodiphenyl ethers or those having three or four benzene nuclei and being linked through ether bond such as bis(aminophenoxy)benzenes and bis(aminophenoxyphenyl)propanes are used, the aforementioned preferable aromatic diamine compounds are obtained.

$R_1$, $R_2$, $R_3$ and $R_4$ in the formula (I) are as described above, and hence the aromatic diamine compounds of the present invention are those having one to four allyl groups in one molecule. Each of the compounds may be used alone or as a mixture thereof in the present invention. The preferred are the allylated aromatic diamine compounds having 1.5 to 2.5 allyl groups in average, in a molecule, because such compounds lead to the highest heat resistance.

In the above-mentioned reaction of the aromatic diamine compound with the allyl halide compound, the allyl group number per molecule is controlled by varying an amount of the allyl halide or the reaction conditions such as reaction period of time.

The allylated aromatic diamine compounds thus obtained and used in the present invention are liquid at and around room temperature and is easily mixed with the polymaleimide compound.

The polymaleimide compounds used in the present invention are those having in one molecule two or more maleimide groups represented by the formula:

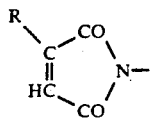

wherein R is a hydrogen atom or a lower alkyl group.

Examples thereof include N,N'-bismaleimide compounds such as N,N'-diphenylmethanebismaleimide, N,N'-phenylenebismaleimide, N,N'-diphenyl ether bismaleimide, N,N'-diphenyl sulfone bismaleimide, N,N'-dicyclohexylmethanebismaleimide, N,N'-xylenebismaleimide, N,N'-tolylenebismaleimide, N,N'-xylylenebismaleimide, N,N'-diphenylcyclohexanebismaleimide, N,N'-dichlorodiphenylmethanebismaleimide, N,N'-diphenylmethanebismethylmaleimide, N,N'-diphenyl ether bismethylmaleimide, N,N'-diphenyl sulfone bismethylmaleimide, N,N'-bis(aminophenoxybenzene)bismaleimide, N,N'-bis(aminophenoxy)bisphenol A bismaleimide (each including the isomers), N,N'-ethylenebismaleimide, N,N'-hexamethylenebismaleimide and N,N'-hexamethylenebismethylmaleimide. Alternatively prepolymers having N,N'-bismaleimide structure at the end, obtained by an addition reaction of any one of the above N,N'-bismaleimide compounds with diamine compounds. Furthermore, aniline-formalin polycondensates made into maleimide form or methylmaleimide form and the like may be employed. In particular, N,N'-diphenylmethanebismaleimide and N,N'-diphenyl ether bismaleimide are preferred.

The composition of the present invention comprising the allylated aromatic diamine compound and the polymaleimide compound may further contain other components such as other aromatic diamines, allyl ether compounds, alkenylphenol compounds and cyano ether compounds insofar as the properties of the present invention are not damaged. Other thermosetting resins such as phenol resin and epoxy resin etc. may also be added in a suitable amount in accordance with the usage.

Quantitative proportion of each component in the resin composition of the present invention are chosen in accordance with its use, required heat resistance and the like. Usually, however, stoichiometric ratio of the allylated aromatic diamine compound to the number of double bond per molecule of the polymaleimide compound is preferably 0.5-2, and more preferably 0.66-1.33.

Thermosetting the resin composition of the present invention is possible either without a catalyst or with a polymerization initiator. The initiator is an organic peroxide, a phosphine compound or an azo compound. The polymerization initiator includes benzoyl peroxide, dicumyl peroxide, triphenylphosphine, azobisisobutyronitrile, tertiary amines, quaternary ammonium salts, imidazoles and the like.

The resin composition of the present invention may be used in combination with fibrous base materials to exhibit excellent heat resistant mechanical properties. The base materials usable therefor are inorganic fibrous base materials such as glass fiber, carbon fiber and alumina fiber, or organic fibrous base materials such as aramid fiber.

Further, the resin composition of the present invention may be used in combination with an extender, a filler, a pigment or the like, if necessary. For example, silica, calcium carbonate, antimony trioxide, kaolin, titanium dioxide, zinc oxide, mica, barite, carbon black, polyethylene powder, polypropylene powder, aluminum powder, iron powder, copper powder and the like may be used. The composition are subjected to shaped articles, laminates, adhesives, composite materials and the like. In accordance with the use of the present composition, it may be blended with other known thermosetting resins such as alkenyl group-containing resins, triazine nucleus-containing resins, unsaturated polyester resins, epoxy resins, silicon resins and/or phenol resins.

The copper-clad laminate of the thermosetting resin is produced in accordance with known methods. For example, the copper-clad laminate is prepared by dissolving the present resin composition into an organic solvent to prepare resin varnish, impregnating a base material with the resulting resin varnish, subjecting the product to a heat treatment to obtain a prepreg sheet, laminating the prepreg sheet with copper foils, and processing the laminate by heating. The solvent may be methyl ethyl ketone, ethylene glycol monomethyl ether, N,N-dimethylformamide, N-methyl-2-pyrrolidone and the like. Examples of the base material are woven fabric, non woven fabric, mat or paper made of inorganic or organic fiber such as glass fiber, polyester fiber and polyamide fiber. Their combination products may also be used. Conditions of the heat treatment may be appropriately chosen in accordance with the solvent, catalysts, and varieties or amounts of additives to be used.

The processing by heating is effected by press-forming at a temperature of 150°-250° C., under a pressure of 10-100 kg/cm$^2$ and for a period of 20-300 minutes.

The thermosetting resin composition of the present invention has low viscosity and is excellent in workability, and it gives shaped products excellent in heat resistance and adhesion. The resin composition is useful, as a material for molding, impregnating, laminating or shaping.

Furthermore, the copper-clad laminate of thermosetting resin according to the present invention exhibits advanced heat resistance and dimensional stability by short period processing and is free from the remaining diaminodiphenylmethane in the prepreg and excellent in adhesion. Thus, it is useful as a multilayer printed circuit substrate.

EXAMPLES

The following examples are illustrated to explain the present invention in more detail, but they are not limitative to the present invention.

Example 1

Preparation of a compound having the following structural formula:

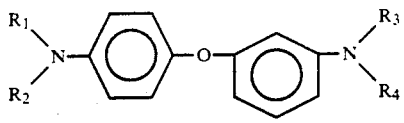

Into a 1 liter four-necked flask equipped with a stirrer, a reflux condenser, a thermometer and a dropping funnel were charged 100.1 g (0.5 mol) of 3,4'-diaminodiphenyl ether and 334 g of dimethyl sulfoxide to make a solution at a room temperature. Thereafter, 83.4 g (1.0 mol) of an aqueous 48% sodium hydroxide solution was added thereto, and then 76.5 g (1.0 mol) of allyl chloride was added dropwise over 2 hours at 30°–40° C. After completion of the dropping, the liquid was kept warm at 50° C. for 4 hours, and then left to stand overnight at room temperature. Successively, 300 g of toluene and 500 g of water were charged thereto, and the organic layer was separated, washed two times with 500 g of an aqueous 15% sodium chloride solution and two times with 500 g of water, and then dehydrated over magnesium sulfate. The solvent was distilled off under a reduced pressure to obtain 130 g of allylated 3,4'-diaminodiphenyl ether in a liquid state.

Figure 2:
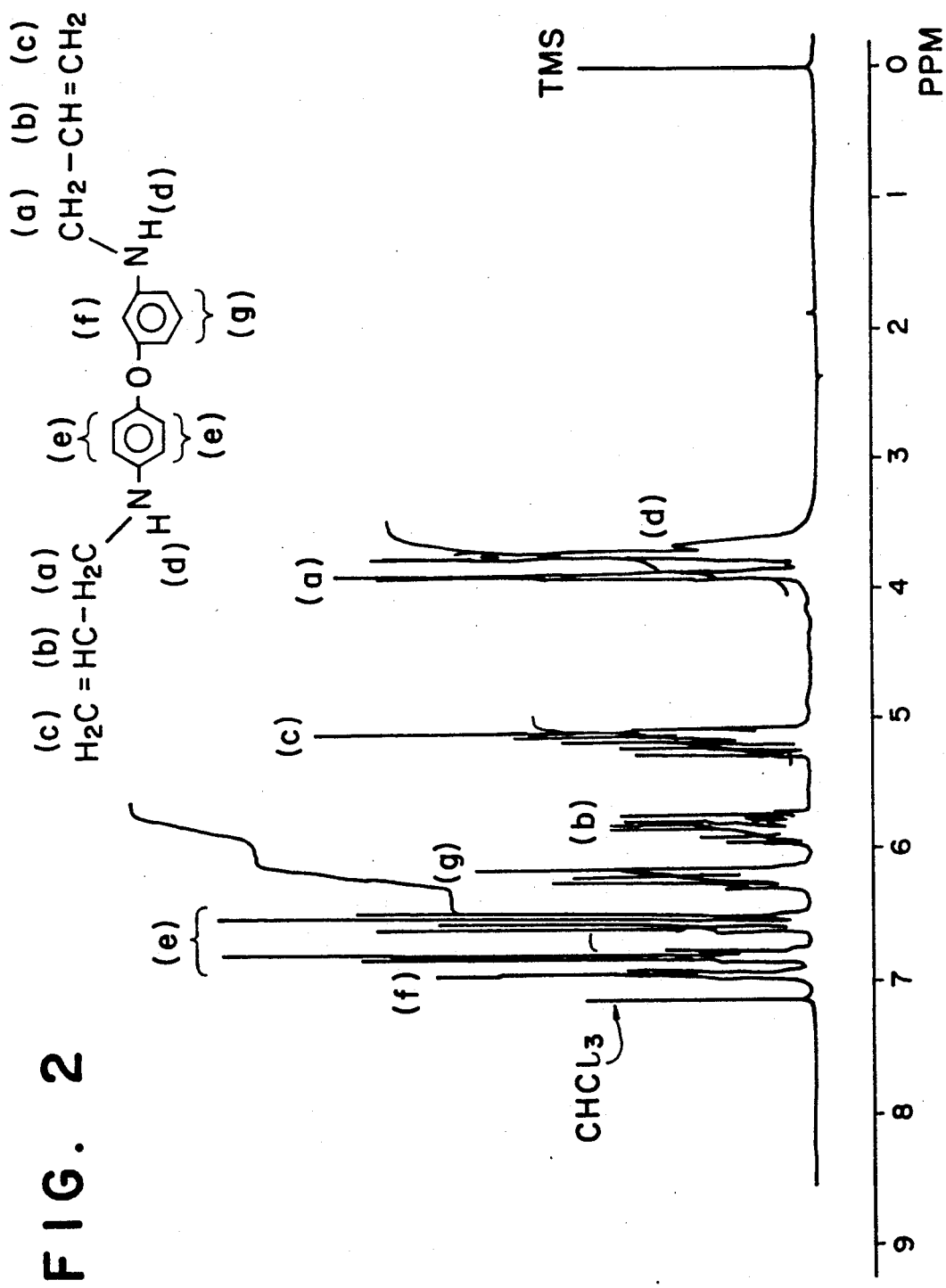

The average allyl group number of the compound was determined by LC as 2.0 per molecule of 3,4'-diaminodiphenyl ether, and the compound was liquid having a viscosity of 3.7 stokes/25° C. FD-MS spectra and NMR spectra of the compound are shown in FIG. 1 and FIG. 2 respectively.

Example 2

Into a 1 liter four-necked flask equipped with a stirrer, a reflux condenser, a thermometer and a dropping funnel were charged 70 g (0.5 mol) of 3,4'-diaminodiphenyl ether allylate having an average allyl group number of 2.0, prepared in Example 1, 400 g of methylene chloride and 152 g (1.5 mol) of triethylamine to make a solution at room temperature. Thereafter 115 g (1.5 mol) of allyl chloride was added dropwise over 2 hours at 25°–40° C. After completion of the dropping, the liquid was kept warm at 40° C. for 48 hours. Triethylamine hydrochloride produced as a by-product was separated by filtration and washed with 400 g of methylene chloride, and the filtrate was concentrated to obtain a crude product. The crude product was dissolved in 400 g of toluene, washed with 500 g of an aqueous 10% sodium hydroxide solution, and then washed three times with 500 g of water to remove triethylamine hydrochloride contained in the crude product. The organic layer was dried over anhydrous magnesium sulfate, and then concentrated under a reduced pressure to obtain 85 g of an allylate having an average allyl group number of 3.9. The compound was liquid having viscosity of 3.5 stokes/25° C.

Example 3

Preparation of a compound having the following structural formula:

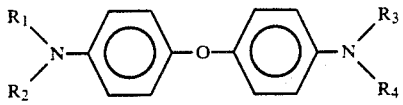

Procedure in Example 1 was repeated except that 4,4'-diaminodiphenyl ether was used in place of 3,4'-diaminodiphenyl ether, to obtain 125 g of 4,4'-diaminodiphenyl ether allylate.

Figure 3:
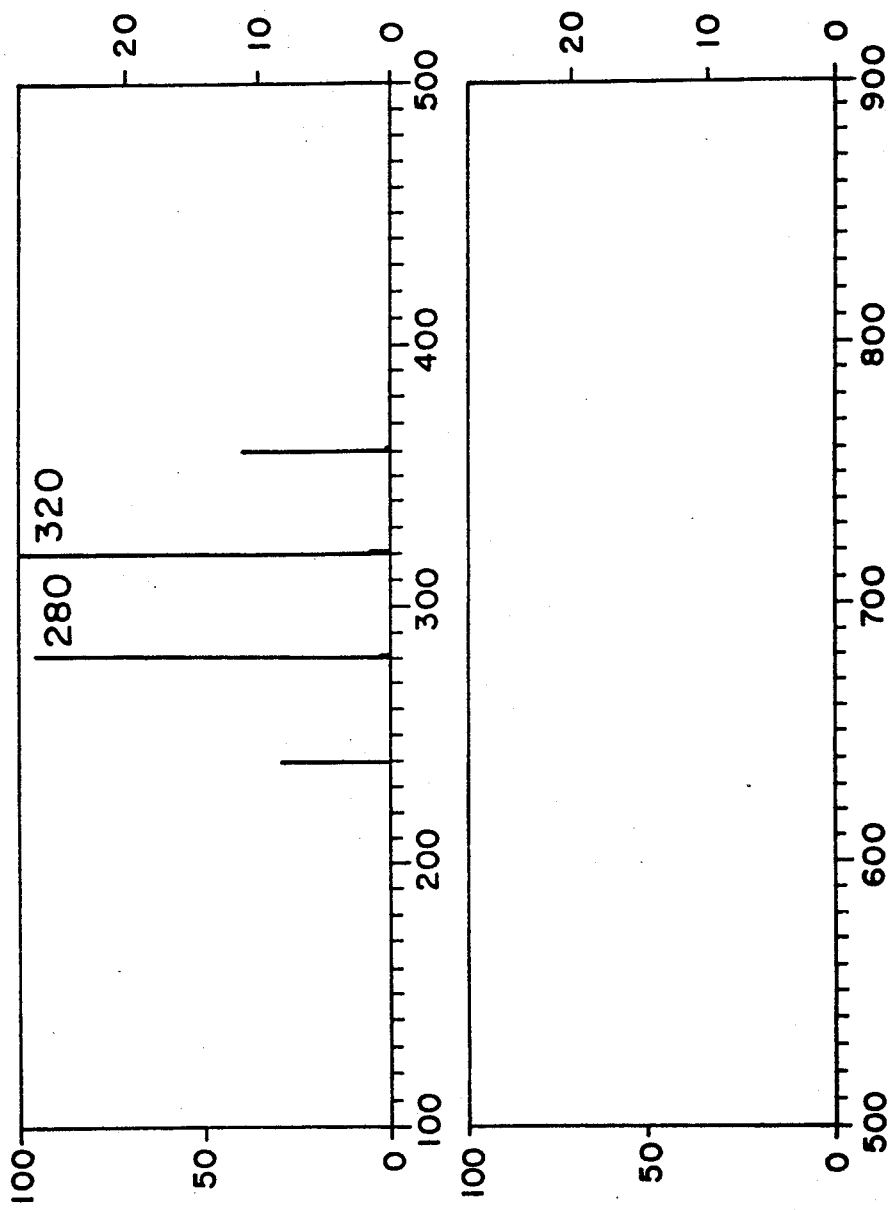
Figure 4:
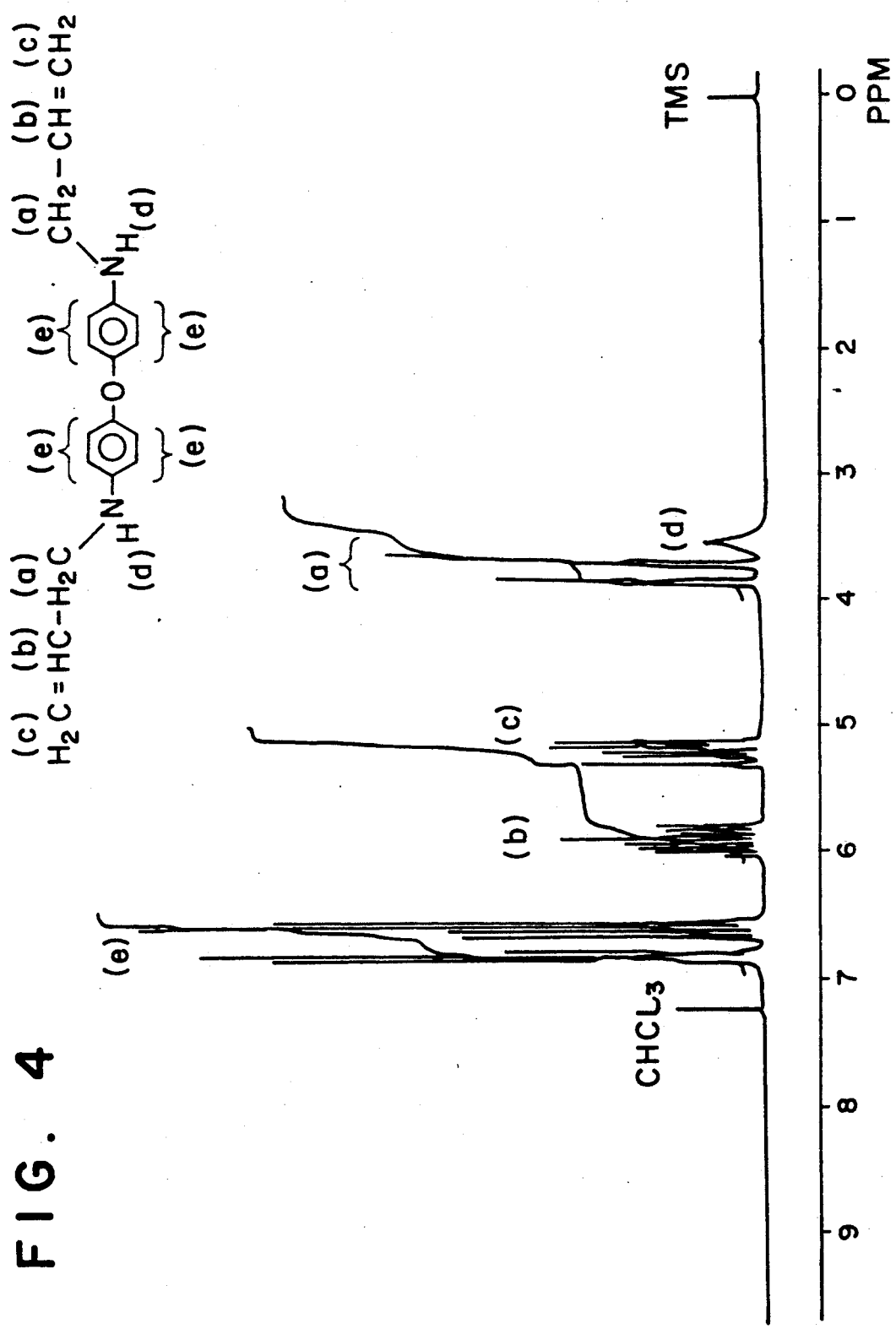

The average allyl group number of the allylate was 2.0 per molecule of 4.4'-diaminodiphenyl ehter, and viscosity thereof was 2.8 stokes/25° C. FD-MS spectra and NMR spectra of the compound are shown in FIG. 3 and FIG. 4, respectively.

Example 4

Procedure in Example 2 was repeated using 4,4'-diaminodiphenyl ether allylate prepared in Example 3 instead of 3,4'-diaminodiphenyl ether allylate to obtain 83 g of an allylate having an average allyl group number of 3.9. The compound was a liquid having viscosity of 2.8 stokes/25° C.

Example 5

Preparation of a compound having the following structural formula:

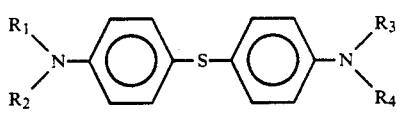

Procedure in Example 1 was repeated except that 108 g of 4,4'-diaminodiphenyl sulfide was used in place of 100 g of 3,4,-diaminodiphenyl ether to obtain 129 g of 4,4'-diaminodiphenyl sulfide allylate.

Figure 5:
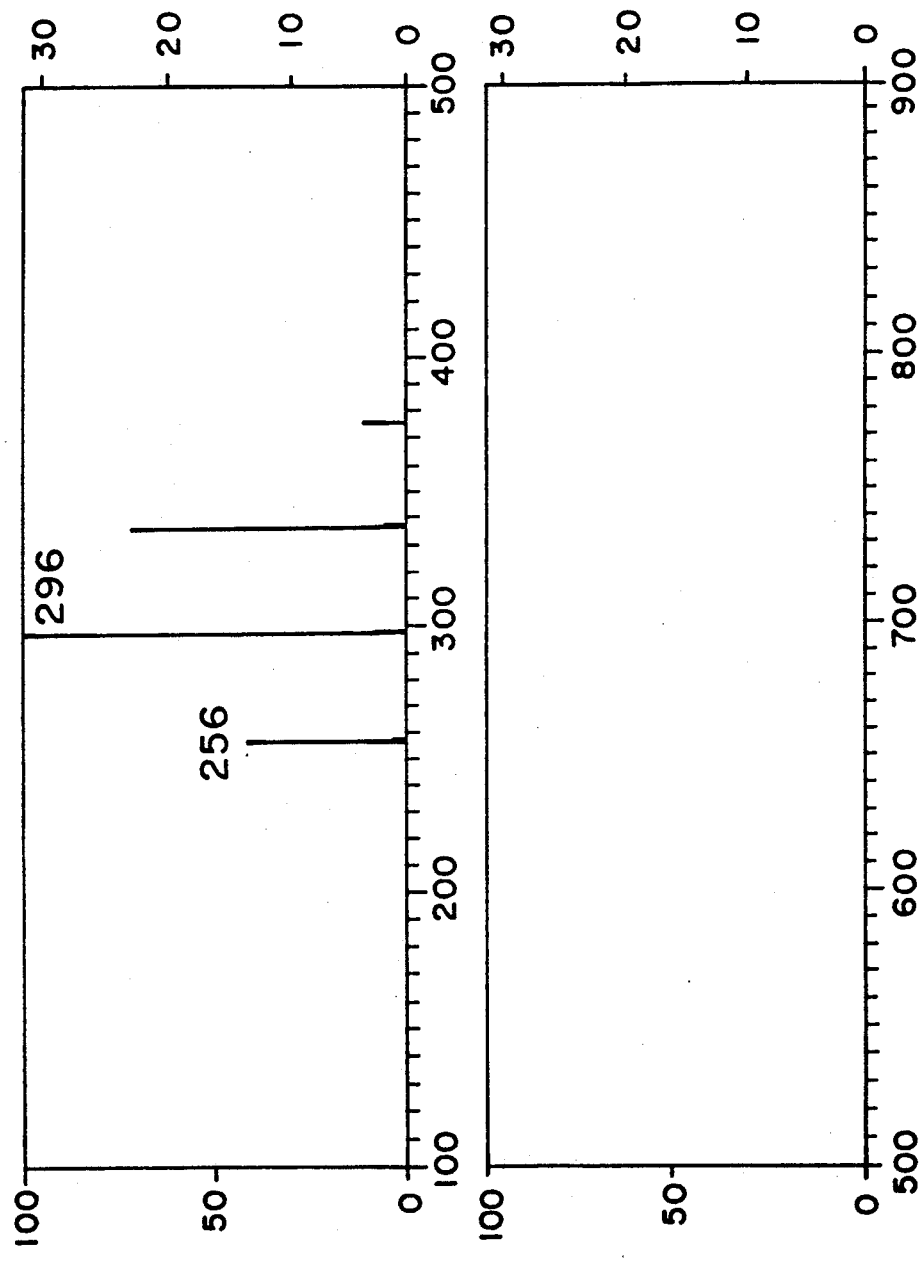
Figure 6:
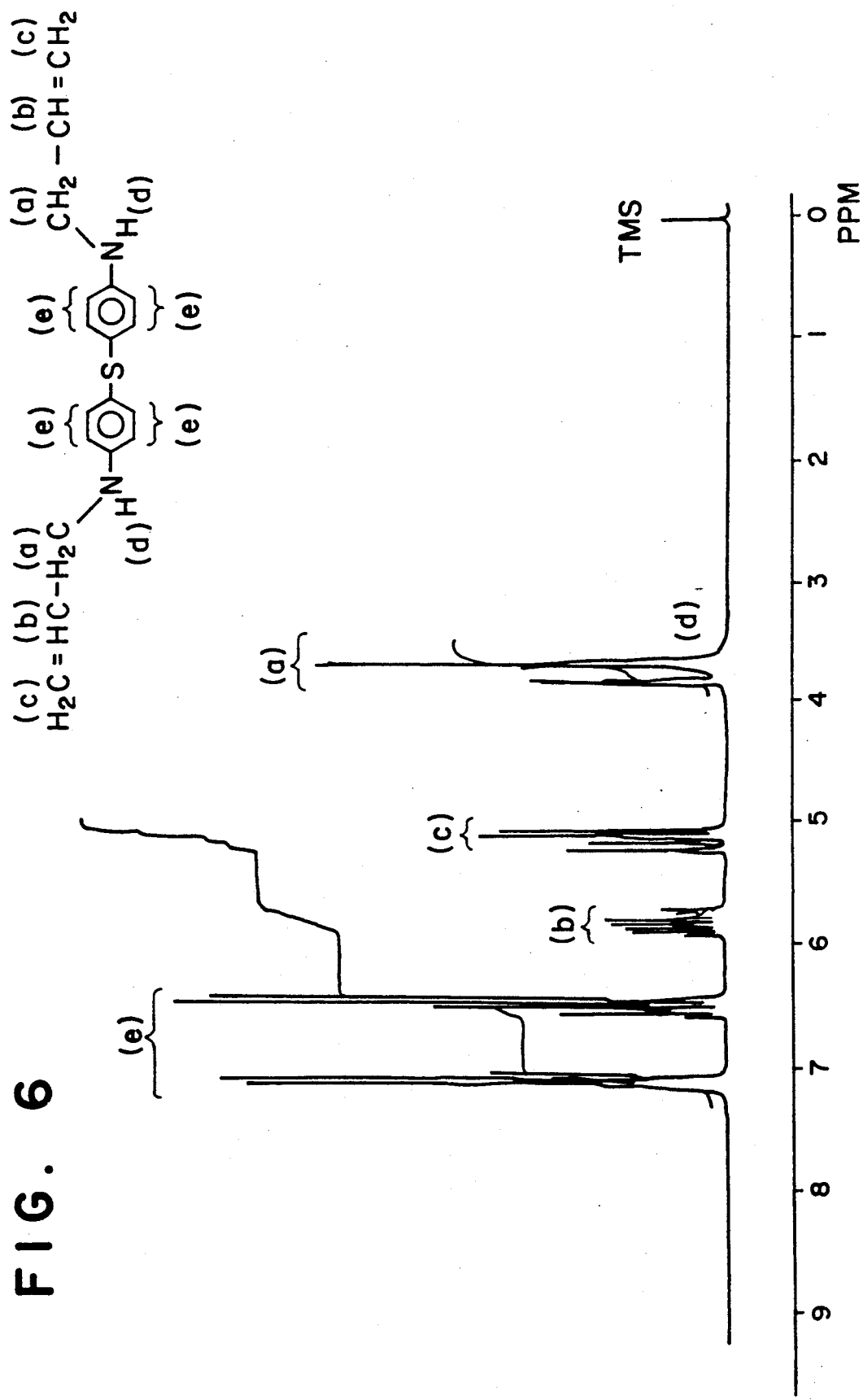

The compound was liquid having an average allyl group number of 2.0 and having viscosity of 3.7 stokes/25° C. FD-MS spectra and NMR spectra of the compound are shown in FIG. 5 and FIG. 6 respectively.

Example 6

Procedure in Example 2 was repeated using 74 g of 4,4'-diaminodiphenyl sulfide allylate prepared in Example 5 to obtain 90 g of an allylate having an average allyl group number of 3.9. The compound was a liquid having viscosity of 2.6 stokes 25° C.

Examples 7–12

The average molecular weight of each allylate prepared in Examples 1–6 was calculated on the basis of the average allyl group number. Each allylate was blended with N,N'-diphenylmethanebismaleimide ("Bestlex" ® BH-180 produced by Sumitomo Chemical Co., Ltd.), and the blend was molten and mixed by heating at 160° C.–170° C., defoamed, poured into a mold previously set in an oven, kept at 150° C. for 1 hour to be gelated, then kept at 200° C for 5 hours, and thereafter released from the mold to make a hardened product of 2 mm in thickness.

Comparative Example I

For the comparison, "Kerimide" ®- 601 (produced by Rhone-Poulenc) comprising N,N'-diphenylmethanebismaleimide and diaminodiphenylmethane was treated in place of the above allylate, but the pouring into the mold like the above was difficult. Thus, it was press-formed at 200° C. and 50 kg/cm² for 1 hour, and then cured at 200° C. for 4 hours to obtain a hardened product of 2 mm in thickness.

Properties of the hardened products obtained in the examples and the comparative example are shown in Table 1.

Figure 9:
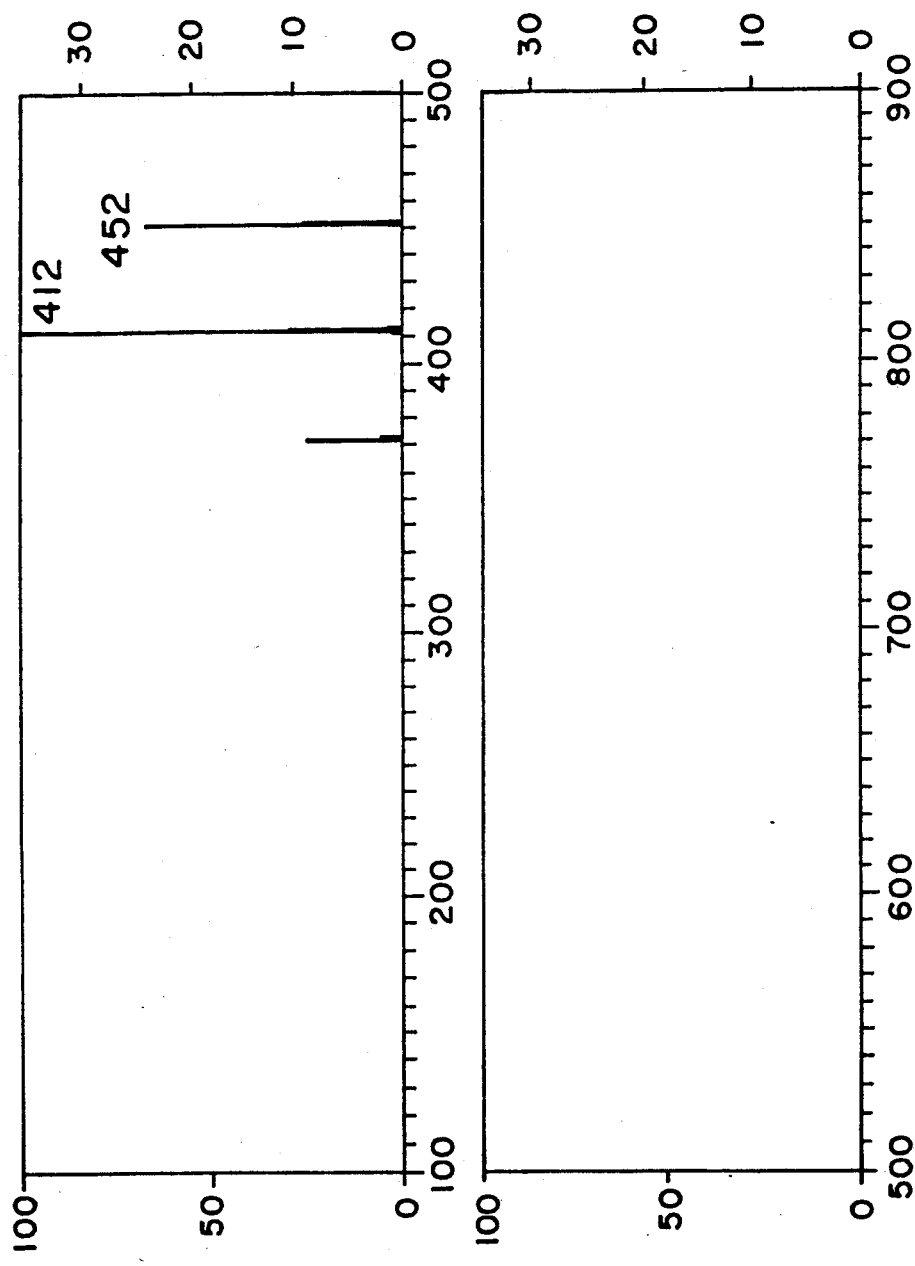
Figure 10:
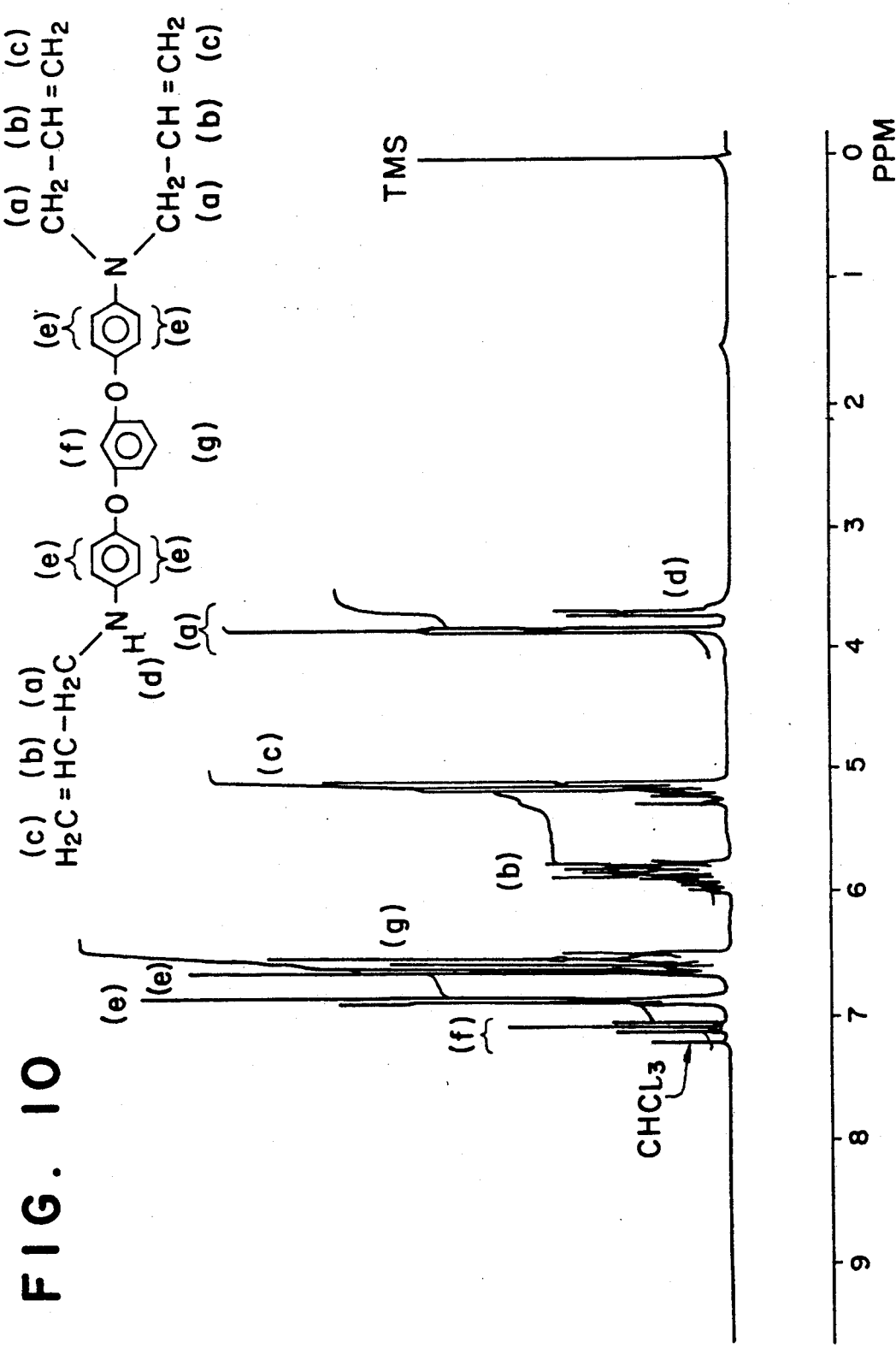

260 g (1.7 mol) of allyl chloride dropwise, and allowing to react at 50° C. for 48 hours, to obtain 107 g of an allylate having an average allyl group number of 3.2. The allylate was a liquid having viscosity of 23 stokes/25° C. FD-MS spectra and NMR-spectra of the compound are shown in FIG. 9 and FIG. 10, respectively.

Example 15

TABLE 1

| Experiment | Blending formulation (parts by weight) | | | | Amount of N,N'-4,4'-diphenylmethane-bismaleimide | Properties of hardened product | | |
|---|---|---|---|---|---|---|---|---|
| | Allylamine compound | | | | | | | |
| | Example No. prepared by | Average allyl group number per molecule | Average molecular weight | Amount | | Tg *1 (°C.) | Bending strength *2 (kg/mm²) | Heating loss *3 (%) |
| Example 7 | Example 1 | 2.0 | 280.2 | 280 | 716 | 260 | 17.7 | 0.88 |
| Example 8 | Example 2 | 3.9 | 356.2 | 356 | 716 | 242 | 17.2 | 0.98 |
| Example 9 | Example 3 | 2.0 | 280.2 | 280 | 716 | 262 | 17.5 | 0.80 |
| Example 10 | Example 4 | 3.9 | 356.2 | 356 | 716 | 240 | 16.8 | 0.92 |
| Example 11 | Example 5 | 2.0 | 296.3 | 296 | 716 | 260 | 16.5 | 0.34 |
| Example 12 | Example 6 | 3.9 | 372.3 | 372 | 716 | 238 | 16.0 | 0.74 |
| Comparative Example 1 | Kerimide ® - 601 | | | | | 226 | 13.7 | 1.82 |

*1 TMA method
*2 JIS K 6911
*3 260° C. × 24 hours

Example 13

Preparation of a compound having the following structural formula:

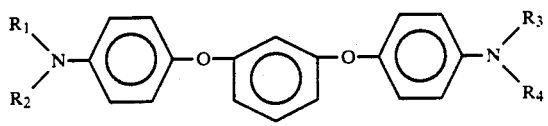

Into a 1 liter four-necked flask equipped with a stirrer, a reflux condenser, a thermometer and a dropping funnel were charged 100 g (0.34 mol) of 1,3-bis(4-aminophenoxy)benzene and 334 g of dimethyl sulfoxide to make a solution at a room temperature. Thereafter 87.2 g (1.0 mol) of an aqueous 48% sodium hydroxide solution was added thereto, and then 76.5 g (1.0 mol) of allyl chloride was added dropwise over 2 hours at 30°-40° C. After completion of the dropping, the liquid was kept warm at 50° C. for 4 hours, and then left to stand overnight at room temperature. Successively, 300 g of toluene and 500 g of water were charged thereto, and the organic layer was separated, washed two times with 500 g of an aqueous 15% sodium chloride solution and two times with 500 g of water, and then dehydrated over magnesium sulfate. The solvent was distilled off under a reduced pressure to obtain 123 g of allylated 1,3-bis(4-aminophenoxy)benzene in a liquid state.

Figure 7:
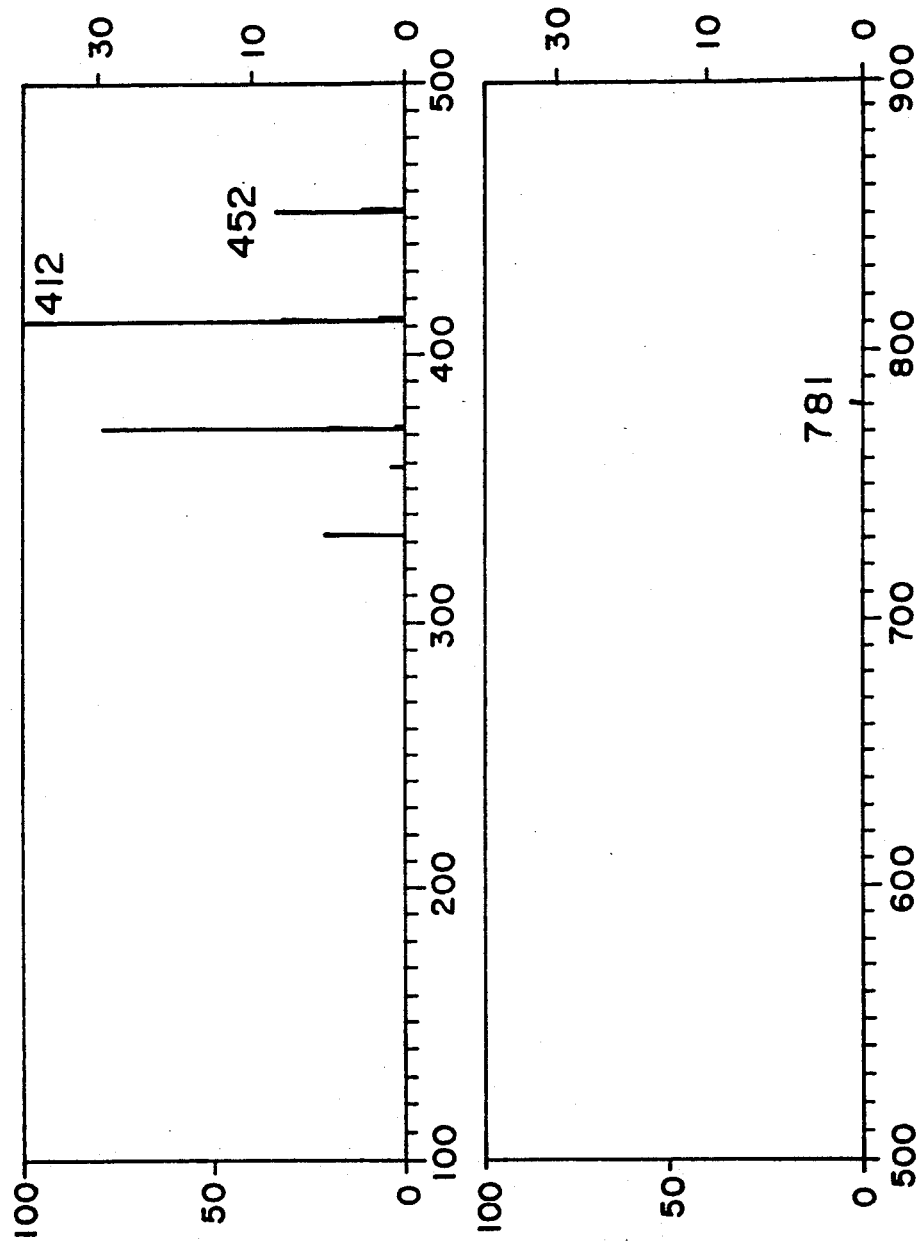
Figure 8:
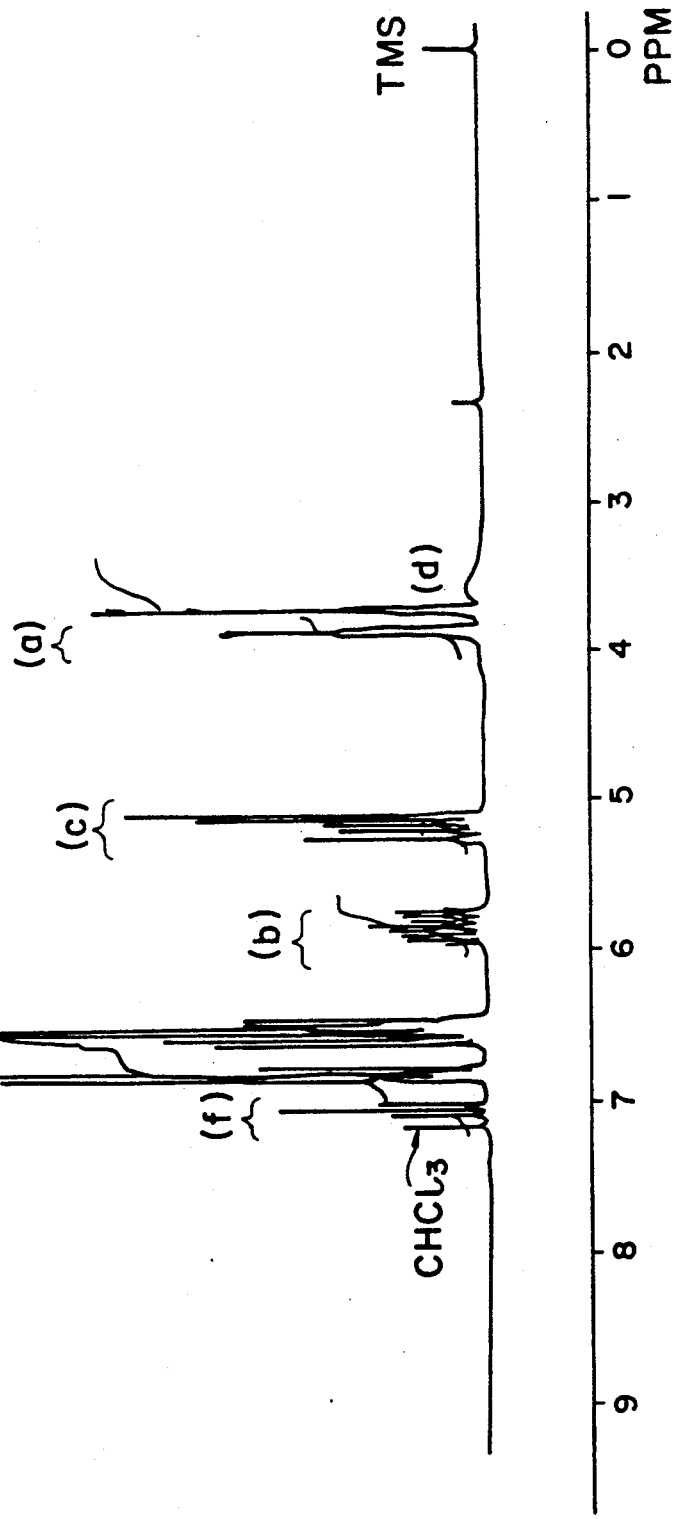

Average allyl group number of the product compound was determined by LC as 2.0 per molecule of 1,3-bis(4-aminophenoxy)benzene, and viscosity was 60 stokes/25° C. FD-MS spectra and NMR spectra of the compound are shown in FIG. 7 and FIG. 8, respectively.

Example 14

Procedure in Example 13 was repeated but using 100 g (0.34 mol) of 1,3-bis(4-aminophenoxy)benzene and 128 g (1.5 mol) of an aqueous 48% sodium hydroxide solution as a hydrochloric acid binding agent, adding Preparation of a compound having the following structural formula:

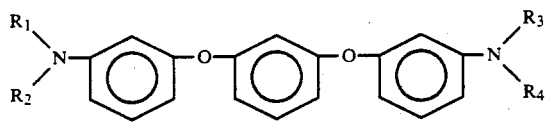

Into a 1 liter four-necked flask equipped with a stirrer, a reflux condenser, a thermometer and a dropping funnel were charged 100 g (0.34 mol) of 1,3-bis(3-aminophenoxy)benzene and 334 g of dimethylformamide to make a solution at room temperature. Thereafter 107 g (1.06 mol) of triethylamine was added thereto as a hydrochloric acid binding agent, then 161 g (2.1 mol) of allyl chloride was added dropwise over 2 hours at 30°-40° C., and allowing to react at 40° C. for 24 hours to obtain 126 g of allylated 1,3-bis-(3-aminophenoxy)-benzene in a liquid state.

Figure 11:
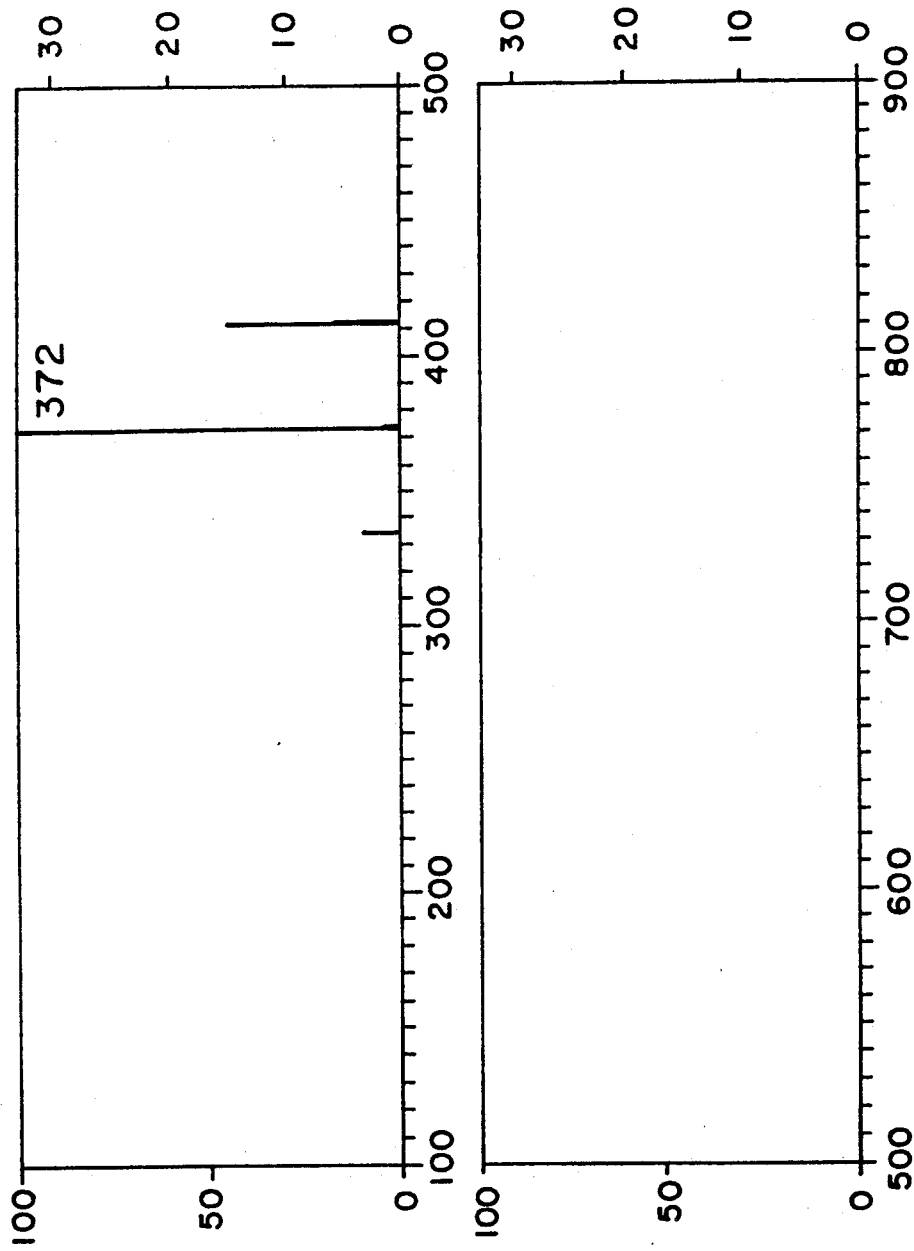
Figure 12:
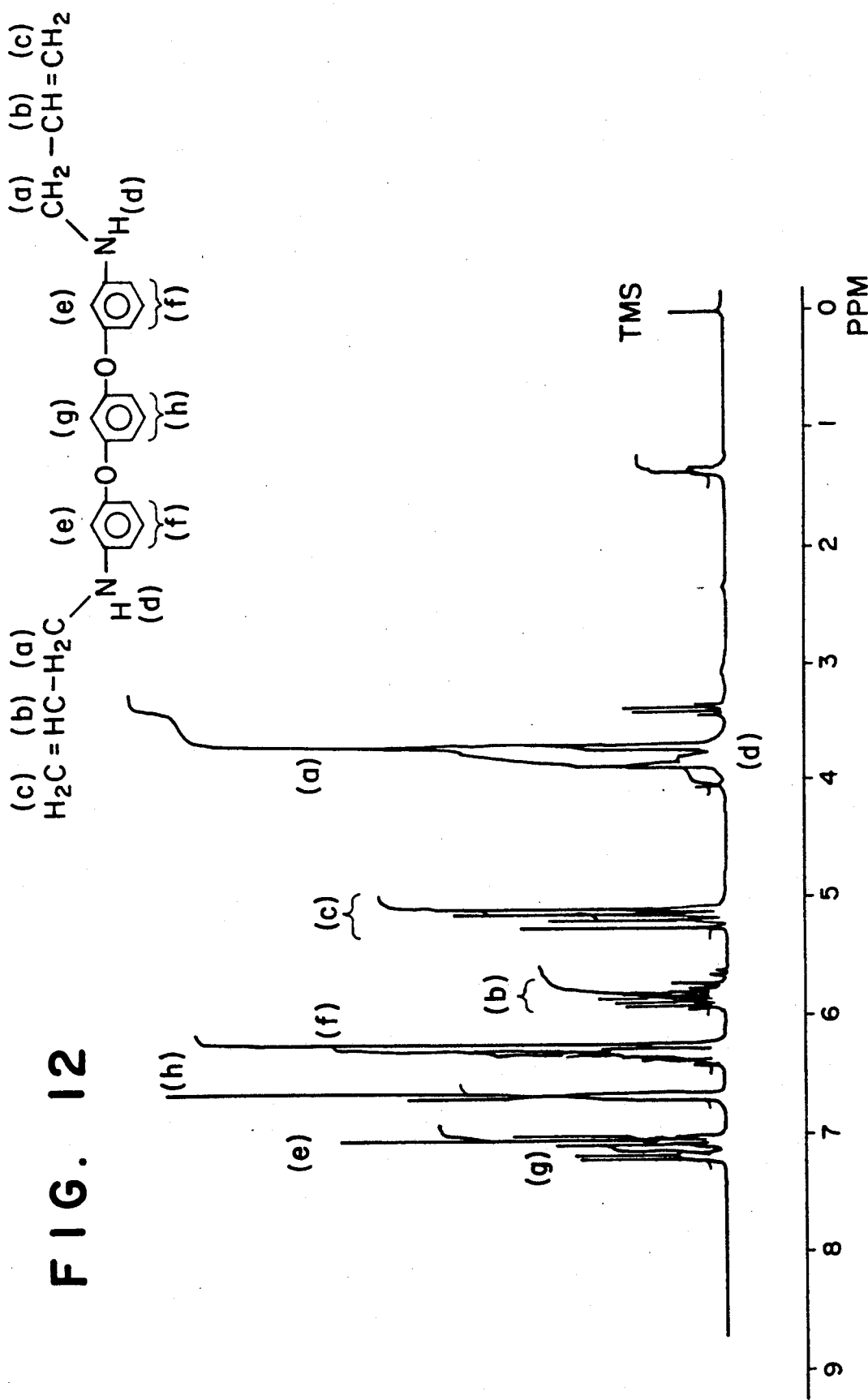

Average allyl group number of the product compound was 2.0 per molecule of 1,3-bis(3-aminophenoxy)benzene, and viscosity was 70 stokes/25° C. FD-MS spectra and NMR spectra of the compound are shown in FIG. 11 and FIG. 12, respectively.

Example 16

Figure 13:
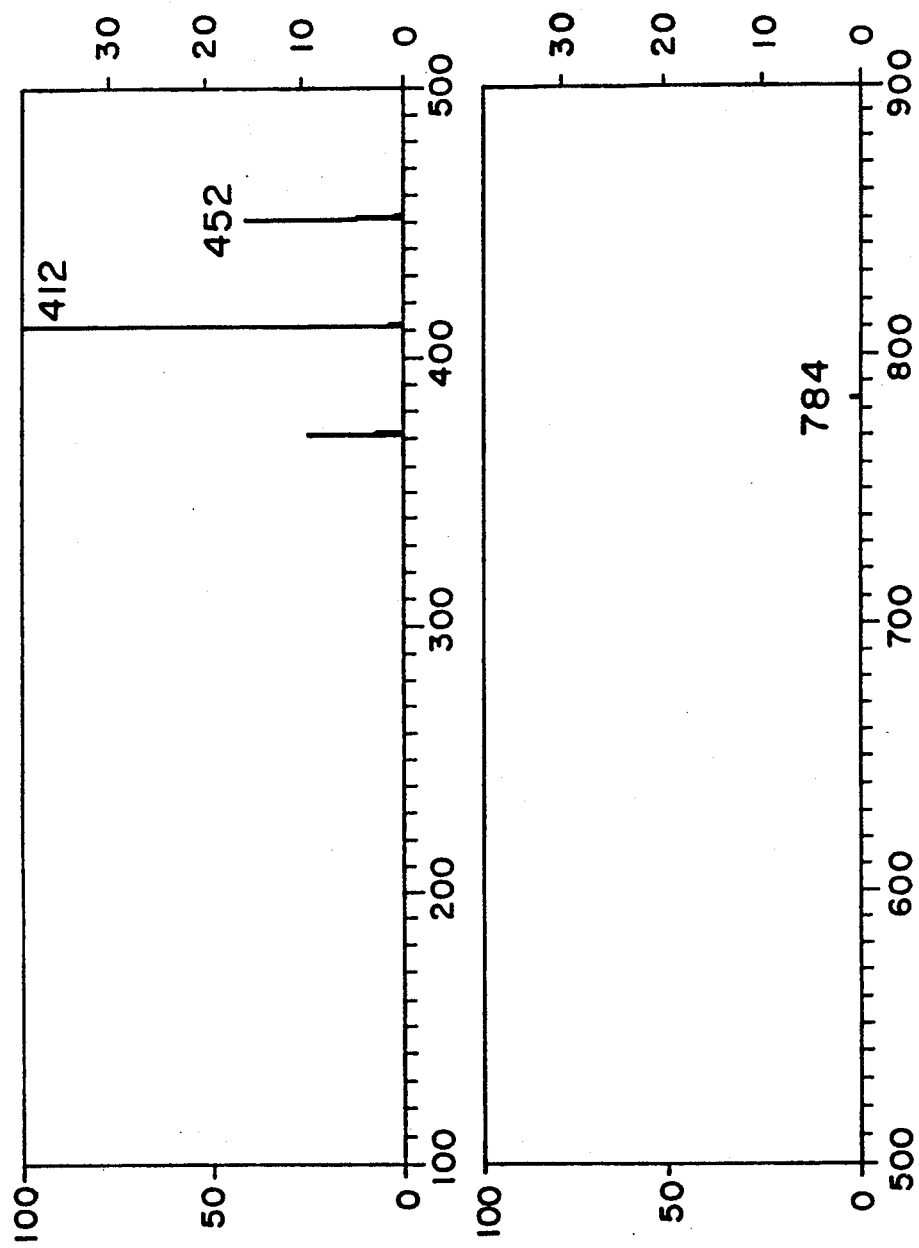
Figure 14:
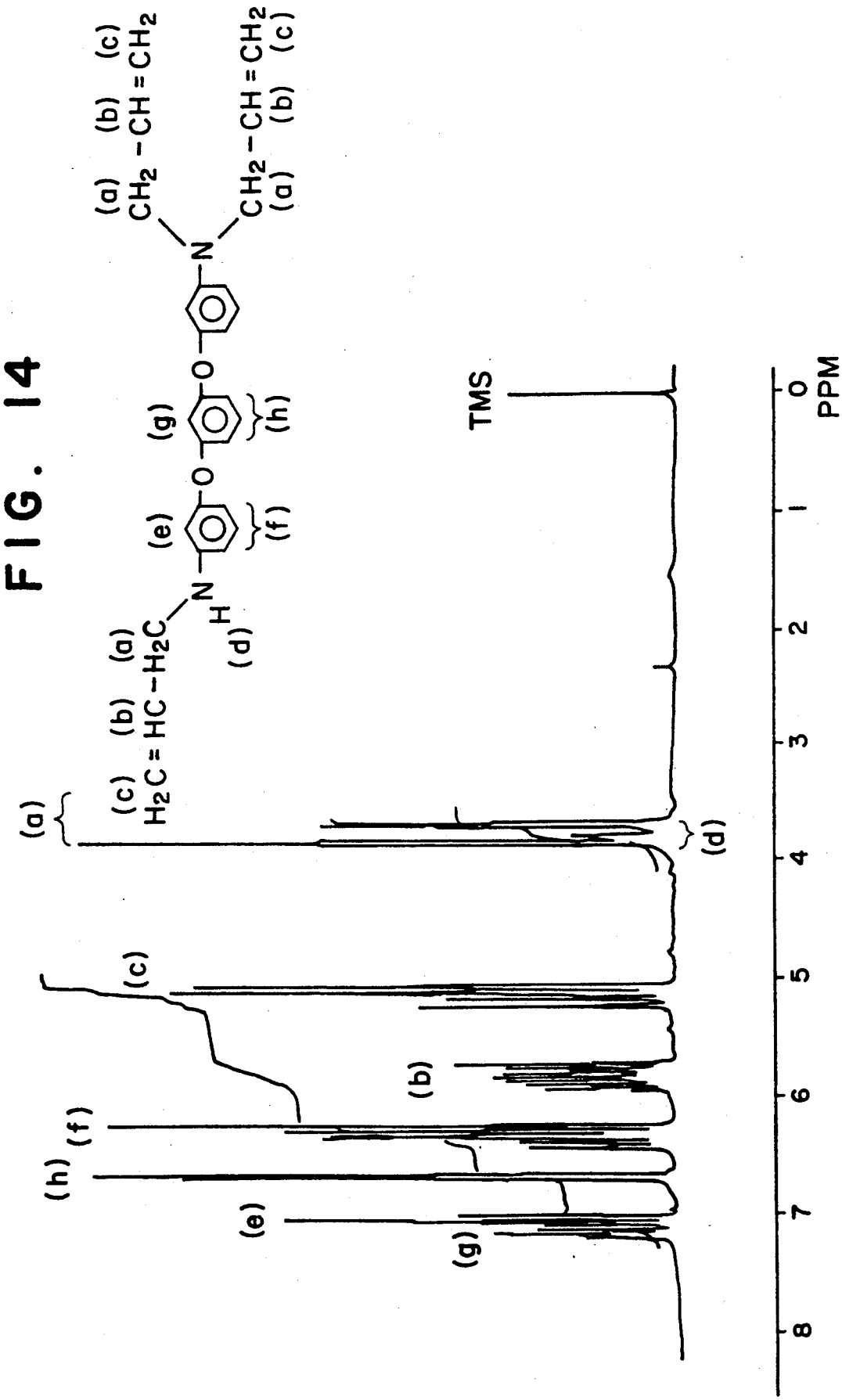

Procedure in Example 15 was repeated but allowing to react at 40° C. for 48 hours to obtain 137 g of an allylate having an average allyl group number of 2.8 and viscosity of 18 stokes/25° C. FD-MS spectra and NMR spectra of the compound are shown in FIG. 13 and FIG. 14, respectively.

Example 17

Preparation of a compound having the following structural formula:

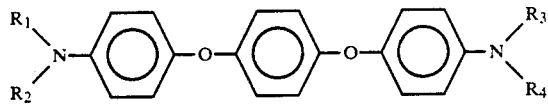

Figure 15:
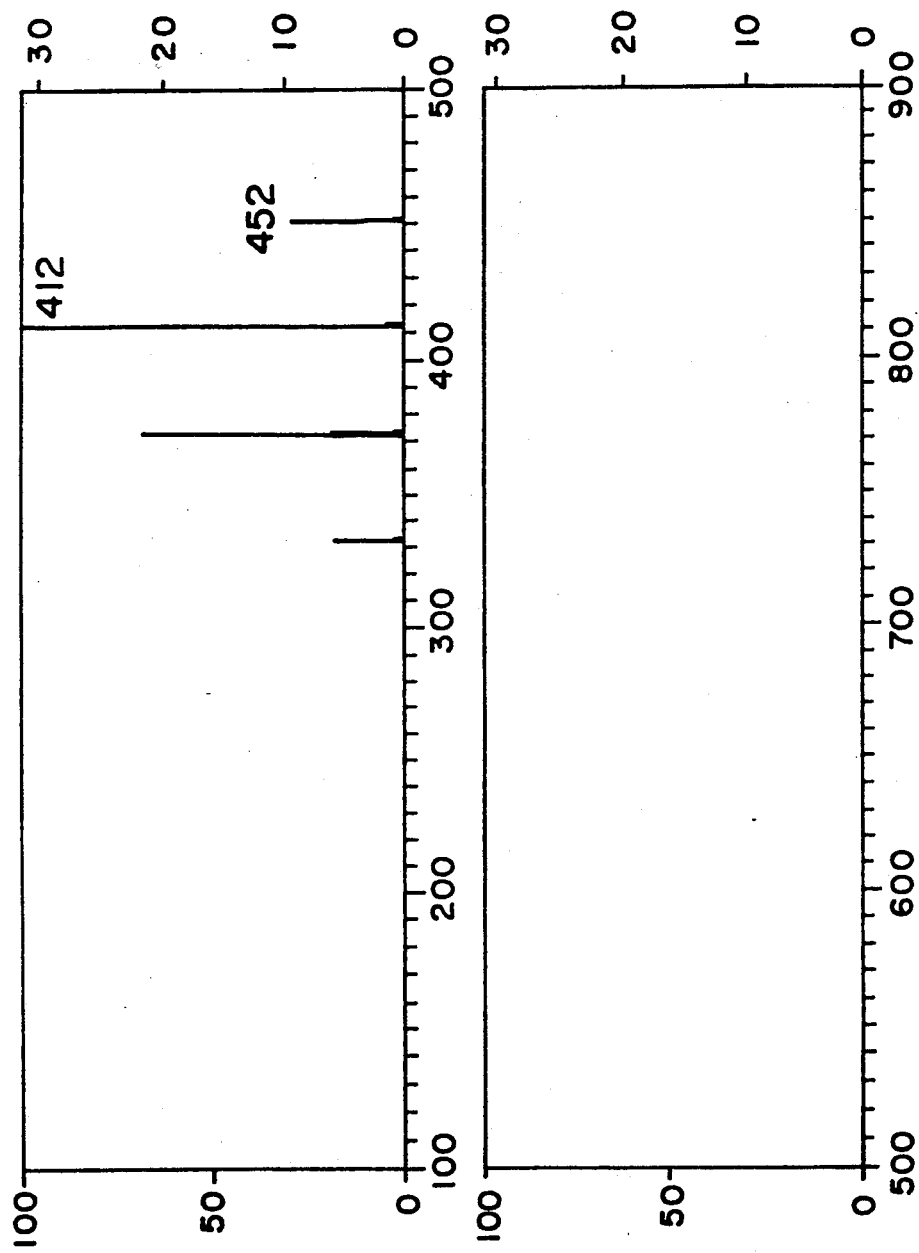
Figure 16:
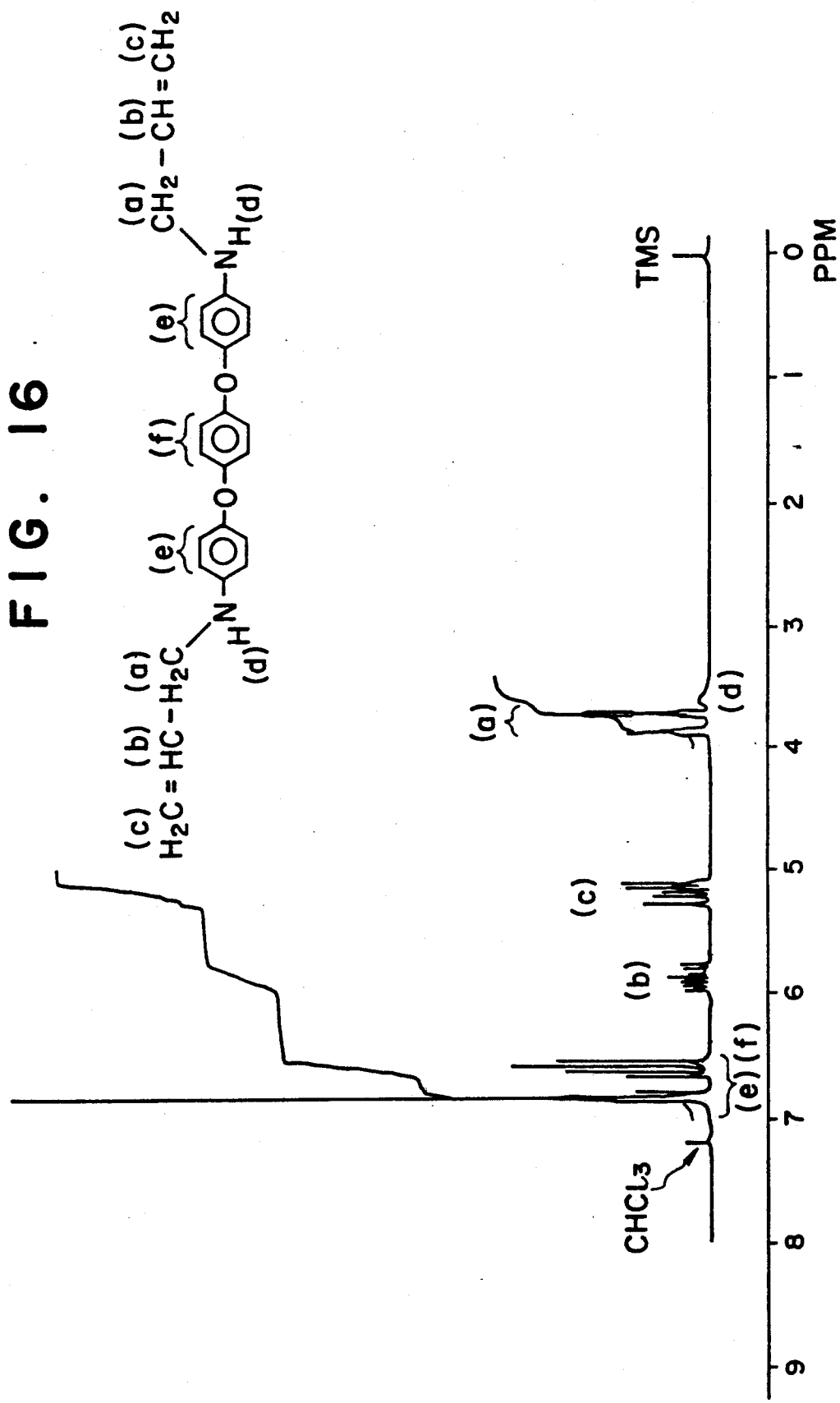

Procedure in Example 13 was repeated but using 100 g (0.34 mol) of 1,4-bis(4-aminophenoxy)benzene and 57 g (0.68 mol) of an aqueous 48% sodium hydroxide solution as a hydrochloric acid binding agent, adding 52.3 g (0.68 mol) of allyl chloride dropwise, and allowing to react at 40° C. for 16 hours to obtain 122 g of an allylate having an average allyl group number of 2.0. It was liquid having viscosity of 20 stokes/25° C. FD-MS spectra and NMR spectra of the compound are shown in FIG. 15 and FIG. 16, respectively.

Example 18

Procedure in Example 17 was repeated but using 100 g (0.34 mol) of 1,4-bis(4-aminophenoxy)benzene and 114 g (1.3 mol) of an aqueous 48% sodium hydroxide solution as a hydrochloric acid binding agnet, adding 104 g (1.3 mol) of allyl chloride dropwise, and allowing to react at 50° C. for 48 hours to obtain 131 g of an allylate having an average allyl group number of 3.0 and viscosity of 17 stokes/25° C.

Example 19

Preparation of a compound having the following structural formula:

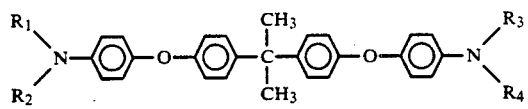

Procedure in Example 15 was repeated but using 82 g (0.2 mol) of 2,2-bis(4-aminophenoxyphenyl)propane and 81 g (0.8 mol) of triethylamine as a hydrochloric acid binding agent, adding 55.1 g (0.72 mol) of allyl chloride dropwise, and allowing to react at 40° C. for 8 hours to obtain 97 g of an allylate having an average allyl group number of 1.8 and viscosity of not lower than 100 stokes/25° C.

Example 20

Figure 17:
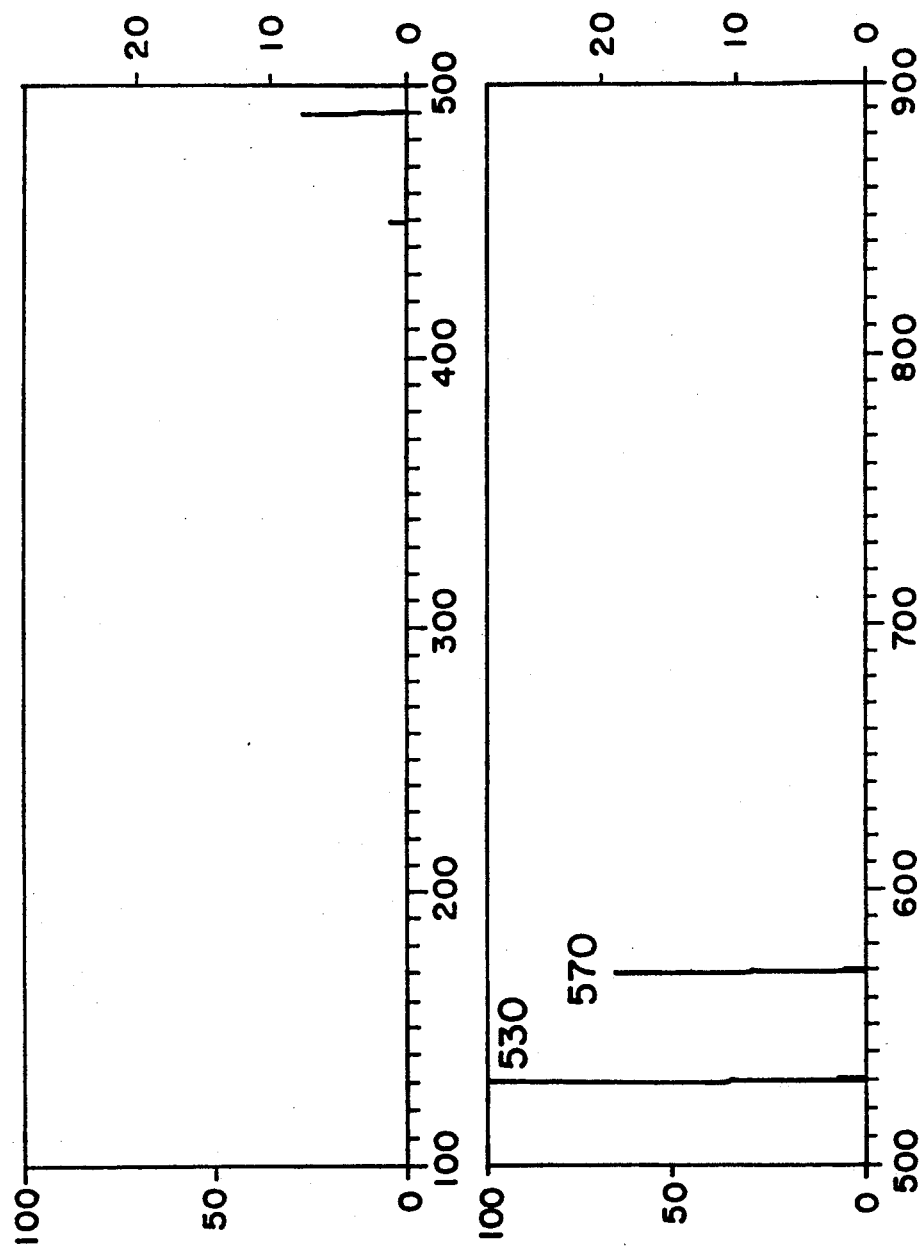
Figure 18:
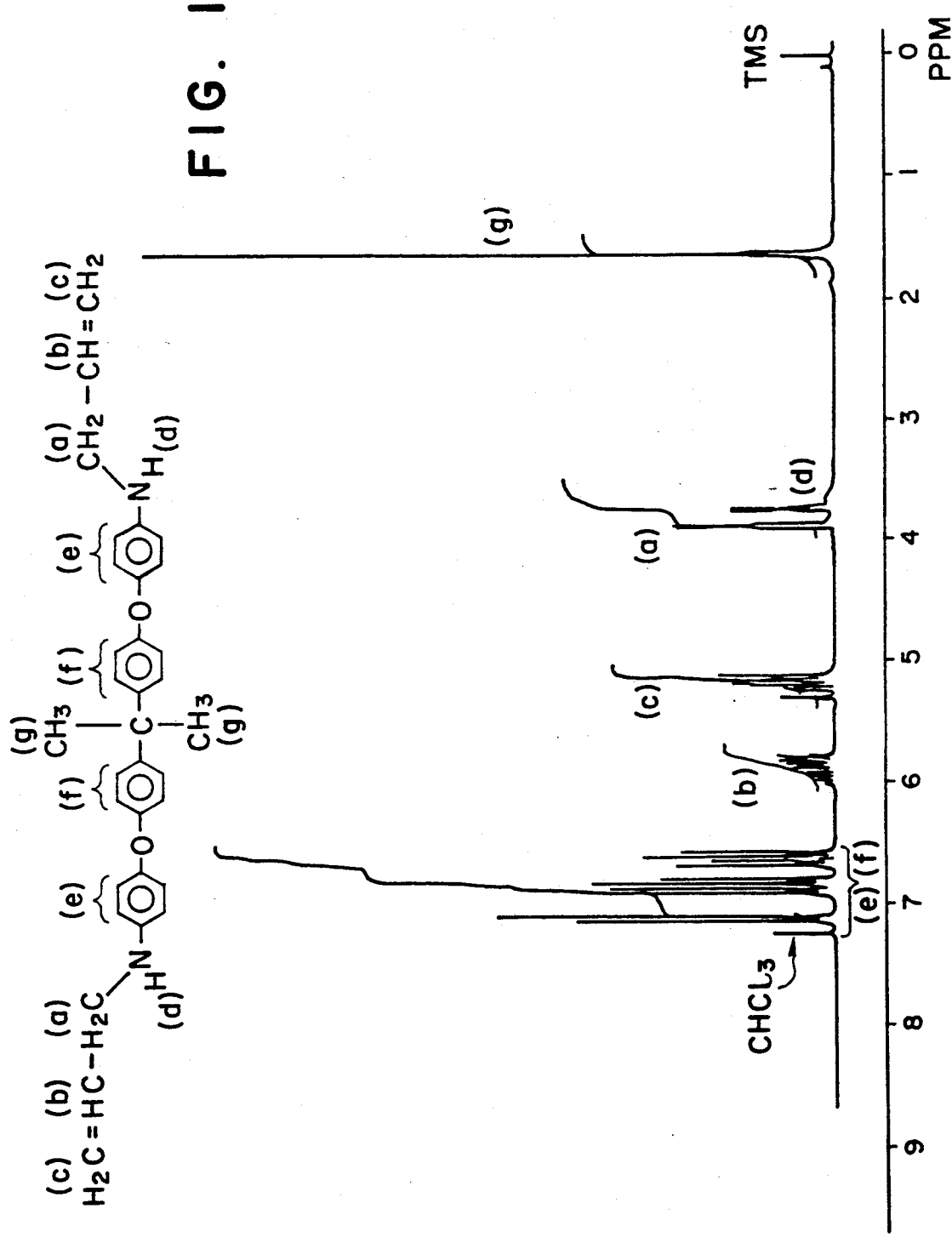

Procedure in Example 19 was repeated but adding 73.5 g (0.96 mol) of allyl chloride dropwise and allowing to react at 40° C. for 16 hours to obtain 100 g of an allylate having an average allyl group number of 2.6. The compound was liquid having viscosity of not lower than 100 stokes/25° C. FD-MS spectra and NMR spectra of the compound are shown in FIG. 17 and FIG. 18, respectively.

Example 21 and Comparative Examples 2-5

The allylate compound prepared as in Example 13 was blended with N,N'-diphenylmethanebismaleimide ("Bestlex" ® BH-180 produced by Sumitomo Chemical Co., Ltd.) in proportions shown in Table 2, and the blend was molten and mixed by heating at 160° C.-170° C., defoamed, poured into a mold previously set in an oven, kept at 150° C. for 1 hour to be gelated, then kept at 200° C. for 5 hours, and thereafter released from the mold to make a hardened product of 2 mm in thickness. For the comparison, N,N'-diphenylmethanebismaleimide was blended with each of 1,3-bis(4-aminophenoxy)benzene (Comparative Example 2), 1,3-bis(3-aminophenoxy)benzene (Comparative Example 3), 1,4-bis(4-aminophenoxy)benzene (Comparative Example 4), 2,2-bis(4-aminophenoxyphenyl)propane (Comparative Example 5) in a molar ratio of 1:0.4 respectively, and the each blend was molten and mixed by heating, press-formed at 200° C. and 50 kg/cm² for 1 hour, and then cured at 200° C. for 4 hours to obtain respective hardened products of 2 mm in thickness. Properties of each hardened product obtained are shown in Table 2.

TABLE 2

| Experiment | Example 21 | Comparative Example 2 | Comparative Example 3 | Comparative Example 4 | Comparative Example 5 |
|---|---|---|---|---|---|
| Allylate of 1,3-bis(4-aminophenoxy)-benzene (compound of Example 13) | 372 | — | — | — | — |
| 1,3-Bis(4-aminophenoxy)benzene | — | 237 | — | — | — |
| 1,3-Bis(3-aminophenoxy)benzene | — | — | 237 | — | — |
| 1,4-Bis(4-aminophenoxyphenyl)-benzene | — | — | — | 237 | — |
| 2,2-Bis(4-aminophenoxyphenyl)-propane | — | — | — | — | 328 |
| N,N'-4,4'-Diphenylmethanebis-maleimide | 716 | 716 | 716 | 716 | 716 |
| Tg *1 (°C.) | 257 | 187 | 190 | 192 | 198 |
| Bending strength *2 (kg/mm²) | 17.6 | 15.4 | 15.8 | 15.8 | 13.7 |

*1 TMA method
*2 JIS K 6911

The compositions of the present invention comprising an allylated aromatic diamine compound and a polymaleimide compound were easily processed and were excellent in heat resistance and in toughness as compared with the compositions comprising an aromatic diamine compound and a polymaleimide compound in comparative Examples 2-5.

Examples 22-29

Each of the allylated aromatic diamines prepared in Examples 13-20 was blended with N,N'-diphenylmethanebismaleimide ("Bestlex" ® BH-180 produced by Sumitomo Chemical Co., Ltd.) in proportions shown in Table 3 respectively, and each blend was molten and mixed by heating at 150° C. -160° C. and kept warm for 10-20 minutes under stirring to obtain a prepolymer having viscosity of 6-7 poise at 150° C. By dissolving 60 parts of the prepolymer in 40 parts of N,N-dimethylformamide, a resin varnish was prepared in the state free from isolation of N,N'-diphenylmethanebismaleimide. A glass cloth (KS-1600 produced by Kanebo, Ltd.; aminosilane treatment) was impregnated with the varnish, and subjected to a heat treatment at 160° C. for 10-20 minutes in an oven to make prepreg. Six sheets of the prepreg were laminated with copper foils (produced by Furukawa Circuit Foil Co., Ltd.; TTAI treatment, 35 μ in thickness) and press-formed at 200° C. under a pressure of 50 kg/cm² for 2 hours to obtain a copper-clad laminate having a thickness of 1 mm. Properties of the laminate were determined in accordance with JIS C 6481, and the results as shown in Table 3 were obtained. Bending strength at 240° C. was determined using a laminate of 1.6 mm in thickness formed from 8 sheets of the above prepreg under the same conditions.

TABLE 3

| Experiment | Example 22 | Example 23 | Example 24 | Example 25 | Example 26 | Example 27 | Example 28 | Example 29 |
|---|---|---|---|---|---|---|---|---|
| Allylamine compound | | | | | | | | |
| Allylated diamine compound | Example 13 | Example 14 | Example 15 | Example 16 | Example 17 | Example 18 | Example 19 | Example 20 |
| Average allyl group number per molecule | 2.0 | 3.2 | 2.0 | 2.8 | 2.0 | 3.0 | 1.8 | 2.6 |
| Average molecular weight | 372.3 | 420.3 | 372.3 | 404.3 | 372.3 | 412.3 | 482.5 | 514.5 |
| Blend | | | | | | | | |
| Diamine compound | 372 | 420 | 372 | 404 | 372 | 412 | 482 | 514 |
| N,N'-4,4'-Diphenyl-methanebismaleimide | 761 | 716 | 716 | 716 | 761 | 716 | 716 | 716 |
| Properties of hardened product | | | | | | | | |
| Tg* (°C.) | 243 | 250 | 214 | 213 | 246 | 240 | 232 | 208 |
| Copper foil-peeling strength (kg/mm) | 1.4 | 1.5 | 1.6 | 1.6 | 1.4 | 1.4 | 1.3 | 1.5 |
| Soldering resistance at 300° C. | | | | | | | | |
| Normal | >3 min | >3 min | >3 min | >3 min | >3 min | >3 min | >3 min | >3 min |
| Boiled | >3 min | >3 min | >3 min | >3 min | >3 min | >3 min | >3 min | >3 min |

*Using a thermal analyzer DT-40 manufactured by Shimadzu Corporation (TMA method).

Example 30

Into a 1 liter four-necked flask equipped with a stirrer, a reflux condenser, a thermometer and a dropping funnel were charged 99.2 g (0.5 mol) of 4,4'-diaminodiphenylmethane and 334 g of dimethyl sulfoxide to make a solution at room temperature. Thereafter, 70.8 g (0.85 mol) of an aqueous 48% sodium hydroxide solution was added to the solution, and then 65.1 g (0.85 mol) of allyl chloride was added dropwise over 2 hours at 30–40° C. After completion of the dropping, the liquid was kept warm at 50° C. for 4 hours, and then left to stand overnight at room temperature. Successively, 300 g of toluene and 500 g of water were charged thereto, and the organic layer was separated, washed two times with 500 g of an aqueous 15% sodium chloride solution and two times with 500 g of water, and then dehydrated over magnesium sulfate. The solvent was distilled off under a reduced pressure to obtain 96.0 g of diaminodiphenylmethane in a liquid state.

Average allyl group number of the product compound was determined by LC as 1.7 per molecule of the diaminodiphenylmethane. The compound was liquid having viscosity of 1.4 stokes/25° C.

Example 31

Procedure in Example 30 was repeated except that the amounts of allyl chloride and the 48% sodium hydroxide solution were changed to 88.0 g (1.15 mol) and 95.8 g (1.15 mol), respectively, thereby obtaining 144 g of an allylate having an average allyl group number of 2.3. It was liquid having viscosity of 1.1 stokes/25° C.

Example 32

Procedure in Example 30 was repeated except that the amounts of allyl chloride and 48% sodium hydroxide solution were changed to 168.5 g (2.2 mol) and 185.2 g (2.22 mol), respectively, thereby obtaining 156 g of an allylate having an average allyl group number of 3.0. It was liquid having viscosity of 0.8 stokes/25° C.

Example 33

Into a 1 liter four-necked flask equipped with a stirrer, a reflux condenser, a thermometer and a dropping funnel were charged 156 g of the allylate of diaminodiphenylmethane having an average allyl group number of 3.0 as prepared in Example 32, 400 g of methylene chloride and 152 g (1.5 mol) of triethylamine to make a solution at room temperature. Thereafter 115 g (1.5 mol) of allyl chloride was added dropwise over 2 hours at 25°–40° C. After completion of the dropping, the liquid was kept warm at 40° C. for 48 hours. Triethylamine hydrochloride produced as a by-product was separated by filtration and washed with 400 g of methylene chloride, and the filtrate was concentrated to obtain a crude product. The crude product was dissolved in 400 g of toluene, washed with 500 g of an aqueous 10% sodium hydroxide solution, and then washed three times with 500 g of water to remove triethylamine hydrochloride contained in the crude product. The organic layer was dried over anhydrous magnesium sulfate, and then concentrated under a reduced pressure to obtain 170 g of an allylate having an average allyl group member number of 3.9. It was liquid having viscosity of 1.3 stokes/25° C.

Examples 34–37 and Comparative Example 6

The average molecular weight of each allylated diaminodiphenylmethane prepared in Examples 30–33 was calculated on the basis of the average allyl group number thereof. Each of them was blended with N,N'-diphenylmethanebismaleimide ("Bestlex" ® BH-180 produced by Sumitomo Chemical Co., Ltd.) in charging molar ratio of 1:2 (corresponding to 1/4 of the allylated diamine to the maleimide group), and the blend was molten and mixed by heating at 160°–170° C., defoamed, poured into a mold previously set in an oven kept at 150° C. for 1 hour to be gelated, then kept at 200° C. for 5 hours, and thereafter released from the mold to make a hardened product of 2 mm in thickness.

As comparative Example 6, "Kerimide" ®-601 (produced by Rhone-Poulenc) comprising N,N'-diphenylmethanebismaleimide and diaminodiphenylmethane was used, but was not so easily poured as the above. Thus, it was press-formed at 200° C. and 50 kg/cm² for 1 hour, and then cured at 200° C. for 4 hours to obtain a hardened product of 2 mm in thickness. Properties of each hardened product are shown in Table 4.

Example 40

Procedure in Example 38 was repeated except that amounts of the allyl chloride and the 48% sodium hydroxide solution were changed to 76.5 g (1.0 mol) and 83.3 g (1.0 mol), respectively to obtain 133 g of an allylate having an average allyl group number of 2.0.

TABLE 4

| Experiment | | Example 34 | Example 35 | Example 36 | Example 37 | Comparative Example 6 |
|---|---|---|---|---|---|---|
| Allylamine compound | | | | | | |
| Allylated diamine compound | | Example 30 | Example 31 | Example 32 | Example 33 | — |
| Average allyl group number per molecule | | 1.7 | 2.3 | 3.0 | 3.9 | — |
| Average molecular weight | | 266.3 | 290.3 | 318.3 | 354.3 | — |
| Blend | | | | | | |
| Diamine compound | | 266 | 290 | 318 | 354 | "Kerimide" ® - 601 |
| N,N'-4,4'-Diphenylmethanebismaleimide | | 716 | 716 | 716 | 716 | |
| Properties of hardened product | | | | | | |
| Tg *1 | °C. | 260 | 267 | 245 | 236 | 226 |
| Bending strength *2 | Kg/mm² | 16.1 | 15.4 | 15.4 | 15.7 | 13.7 |
| Heating loss *3 | % | 0.56 | 0.51 | 0.75 | 1.00 | 1.82 |

*1 TMA method
*2 JIS K 6911
*3 260° C. × 24 hours

Example 38

Into a 1 liter four-necked flask equipped with a stirrer, a reflux condenser, a thermometer and a dropping funnel were charged 99.2 g (0.5 mol) of 4,4'-diaminodiphenylmethane and 334 g of dimethyl sulfoxide to make a solution at room temperature. Thereafter 58.3 g (0.70 mol) of an aqueous 48% sodium hydroxide solution was added thereto, and then 53.6 g (0.7 mol) of allyl chloride was added dropwise over 2 hours at 30-40° C. After completion of the dropping, the liquid was kept warm at 50° C. for 4 hours, and then left to stand overnight at room temperature. Successively, 300 g of toluene and 500 g of water were charged thereto, and the organic layer was separated, washed two times with 500 g of an aqueous 15% sodium chloride solution and two times with 500 g of water, and then dehydrated over magnesium sulfate. The solvent was distilled off under a reduced pressure to obtain 103.0 g of allylated diaminodiphenylmethane in a liquid state.

Average allyl group number of the product compound was determined by LC as 1.2 per molecule of the diaminodiphenylmethane.

Example 39

Procedure in Example 38 was repeated except that amounts of the allyl chloride and the 48% sodium hydroxide solution were changed to 65.1 g (0.85 mol) and 70.8 g (0.85 mol), respectively to obtain 105.9 g of an allylate having an average allyl group number of 1.5.

Examples 41-44

Prepregs were prepared in the same manner as in Example 22 using the allylated aromatic diamines listed in Table 5. Remaining amount of diaminodiphenylmethane in the prepreg each determined by crumpling the prepreg to make resin powder, dissolving the powder in N,N-dimethylformamide in a concentration of 1% and analyzing the solution using gas chromatography. Each prepreg was further shaped to a copper-clad laminate in the same manner as in Example 22, and properties thereof were determined. The results are shown in Table 5.

Comparative Example 7

Sixty (60) parts of "Kerimid" ®- 601 (produced by Rhone-Poulenc) was dissolved in 40 parts of N,N-dimethylformamide to prepare a varnish. In the same manner as in Examples 41-44, a glass cloth was impregnated with the above varnish, subjected to a heat treatment to make a prepreg, and press-formed at 200° C. and 50 kg/cm² for 2 hours to obtain a copper-clad laminate. Properties of the laminate and remaining diaminodiphenylmethane in the prepreg were determined in the same manner as in Examples 41-44. The results are shown in Table 5.

Table 5 shows that the copper-clad laminate of thermosetting resin according to the present invention was excellent in heat resistance, dimensional stability and adhesion, and, further, diaminodiphenylmethane was not detected in the prepreg of the resin.

TABLE 5

| Experiment | Example 41 | Example 42 | Example 43 | Example 44 | Comparative Example 7 |
|---|---|---|---|---|---|
| N,N'-Diphenylmethanebismaleimide | 716 | 716 | 716 | 716 | |
| Allylated aromatic diamine of | | | | | |
| Example 38 | 246 | — | — | — | "Kerimide" ® |
| Example 39 | — | 258 | — | — | |
| Example 40 | — | — | 278 | — | |
| Example 1 | — | — | — | 280 | |

TABLE 5-continued

| Experiment | | Example 41 | Example 42 | Example 43 | Example 44 | Comparative Example 7 |
|---|---|---|---|---|---|---|
| Glass transition temperature* | °C. | 248 | 245 | 253 | 250 | 204 |
| Thermal expansion ratio (20° C.-260° C.)* | % | 1.56 | 1.41 | 1.56 | 1.45 | 2.29 |
| Copper foil-peeling strength | kg/cm | 1.4 | 1.5 | 1.5 | 1.3 | 1.2 |
| Bending strength at 240° C. | kg/mm² | 31.0 | 30.4 | 32.3 | — | 23.2 |
| Soldering resistance at 300° C. | | | | | | |
| Normal | | >3 min | >3 min | >3 min | >3 min | 2' |
| After boiled for 2 hours | | >3 min | >3 min | >3 min | >3 min | 1'40" |
| Remaining diaminodiphenylmethane** in prepreg | % | not detected | not detected | not detected | — | 2.4 |

*A thermal analyzer DT-40 manufactured by Shimadzu Corporation (TMA method).
**Calculated assuming that the resin taken from the prepreg was 100.

We claim:

1. A thermosetting resin composition comprising
(A) an aromatic diamine compound represented by the following formula:

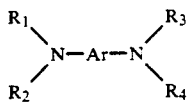

wherein Ar is a divalent aromatic residue, and $R_1$, $R_2$, $R_3$ and $R_4$ each is an allyl group or a hydrogen atom, provided that at least one of $R_1$, $R_2$, $R_3$ and $R_4$ is an allyl group; and (B) a polymaleimide compound having two or more maleimide groups in a molecule thereof.

2. The thermosetting resin composition according to claim 1, wherein Ar is represented by the following formula:

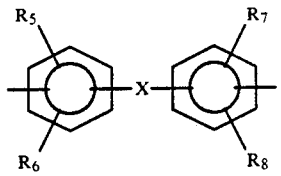

wherein X is

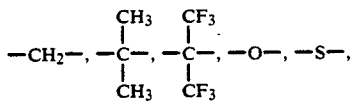

—SO₂—, —CO or —CONH—, and $R_5$, $R_6$, $R_7$ and $R_8$ each is a halogen atom, a lower alkyl group or a hydrogen atom.

3. The thermosetting resin composition according to claim 1, wherein Ar is represented by the following formula:

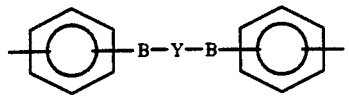

wherein B is —O— or —S—, and Y is

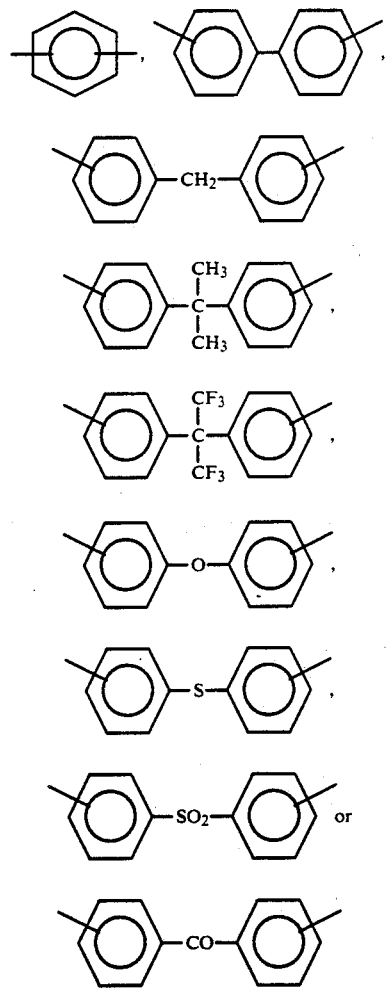

4. The composition according to any one of claims 1-3, wherein the polymaleimide compound (B) is a member selected from the group consisting of N,N'-diphenylmethanebismaleimide, N,N'-phenylenebismaleimide, N,N'-diphenyl ether bismaleimide, N,N'-diphenyl sulfone bismaleimide, N,N'-dicyclohanebismaleimide, N,N'-xylenebismaleimide, N,N'-tolyenebismaleimide, N,N'-xylylenebismaleimide, N,N'-diphenylcyclohexanebismaleimide, N,N'-dichlorodiphenylmethanebismaleimide, N,N'-diphenylmethanebismethylmaleimide, N,N'-diphenyl ether bismethylmaleimide, N,N'-diphenyl sulfone bismethylmaleimide, N,N'-bis-(aminophenoxybenzene)bismaleimide, N,N'-bis(aminophenoxy)bisphenol A bismaleimide (each including the isomers), N,N'-ethylenebismaleimide, N,N'-hexamethylenebismaleimide, N,N'-hexamethylenebismethylmaleimide, a prepolymer having N,N'-bismaleimide structure at the end, obtained by an addition reaction of any one of the above N,N'-bismaleimide compounds with a diamine compound, and a maleimide or methylmaleimide of an aniline-formalin polycondensate.

5. The composition according to any one of claims 1-3, wherein the polymaleimide compound is N,N'-diphenylmethanebismaleimide or N,N'-diphenyl ether bismaleimide.

6. The composition according to claim 1, wherein stoichiometric ratio of the allylated aromatic diamine compound to the number of double bond per molecule of the polymaleimide compound is 0.5-2.

7. The composition according to claim 6, wherein the stoichiometric ratio of the allylated aromatic diamine compound to the number of double bond per molecule of the polymaleimide compound is 0.66-1.33.

* * * * *